United States Patent [19]

Nakase et al.

[11] Patent Number: 5,365,123
[45] Date of Patent: Nov. 15, 1994

[54] SEMICONDUCTOR LOGIC CIRCUITS WITH DIODES AND AMPLITUDE LIMITER

[75] Inventors: Yasunobu Nakase; Hiroshi Makino; Kimio Ueda, all of Hyogo, Japan

[73] Assignee: Mitsubishi Denki Kabushiki Kaisha, Tokyo, Japan

[21] Appl. No.: 937,095

[22] Filed: Aug. 31, 1992

[30] Foreign Application Priority Data

Aug. 29, 1991 [JP] Japan ................................. 3-218509
Jul. 20, 1992 [JP] Japan ................................. 4-192179

[51] Int. Cl.⁵ ..................... H03K 19/01; H03K 19/08
[52] U.S. Cl. .................................. 326/109; 326/110; 327/433
[58] Field of Search ............... 307/446, 451, 443, 460, 307/570

[56] References Cited

U.S. PATENT DOCUMENTS

| | | | |
|---|---|---|---|
| 4,103,188 | 7/1978 | Morton | 307/446 |
| 4,792,100 | 11/1990 | Lim et al. | 307/451 |
| 5,015,889 | 5/1991 | Reay | 307/451 |
| 5,107,141 | 4/1992 | Yano et al. | 307/446 |
| 5,146,118 | 9/1992 | Nakamura et al. | 307/446 |
| 5,159,214 | 10/1992 | Okumura | 307/443 |
| 5,198,704 | 3/1993 | Nitta et al. | 307/446 |

FOREIGN PATENT DOCUMENTS

58-71048  11/1984  Japan ................................. 307/446

OTHER PUBLICATIONS

"Innovative Circuit Design", by Chih-Liang Chen. International Solid-State Circuits Conference Feb. 16, 1990, pp. 236-237.

"Proceedings 1990 Spring National Conference of Institute of Electronics, Information Communications, and Electrics Engineers of Japan", by Mitsuru Hiraki et al, p. 5-189.

"Appraisal of BiCMOS from Circuit Voltage and Delay Time", by M. Fujishima et al, Technical Digest of Symposium on VLSI Circuits, 1990, pp. 91-92.

Primary Examiner—Edward P. Westin
Assistant Examiner—Benjamin D. Driscoll
Attorney, Agent, or Firm—Lowe, Price, LeBlanc & Becker

[57] ABSTRACT

A CMOS gate circuit constituting the input stage of a semiconductor logic circuit includes a p channel MOS transistor supplied with current from a first power supply potential Vdd for charging an output signal line to a high level potential, a diode provided between MOS transistor and output signal line, an n channel MOS transistor supplied with current from a second power supply potential Vss responsive to an input signal (Vin) for discharging the potential of output signal line, and a diode provided between MOS transistor and output signal line. An input signal potential applied to input stage has its logic amplitude set to be Vdd−Vf to Vf. Vf represents the forward voltage of the diodes and the second power supply potential is set to be ground potential GND. The input signal potential has its logic amplitude limited, current flows through the diodes in its steady state, and, therefore, the logic amplitude of the signal potential Vout of output signal line becomes Vdd−Vf to Vf.

34 Claims, 15 Drawing Sheets

SEMICONDUCTOR LOGIC CIRCUITS WITH DIODES AND AMPLITUDE LIMITER

BACKGROUND OF THE INVENTION

1. Field of the Invention

The present invention relates to semiconductor logic circuits, and specifically to a semiconductor logic circuit including a bipolar transistor and a field effect transistor of complimentary type. The present invention relates more specifically to a semiconductor logic circuit capable of stably reducing the logic amplitude of an output signal.

2. Description of the Background Art

A semiconductor logic circuit is often implemented using only complimentary type field effect transistors (hereinafter simply referred to as CMOS transistors) in conventional circuit devices. This is because steady-state current flows through a CMOS transistor only in its switching operation, and the current consumption is reduced compared to a semiconductor logic circuit using a bipolar transistor as an element. In addition, a MOS transistor (insulating gate type field effect transistor) occupies a smaller area than a bipolar transistor, and, therefore, semiconductor logic circuits have higher component densities and integrations year by year.

However, the loads which some logic circuits need to drive increase in accordance with the higher integration. In the case of a circuit intended to supply clock signals to a number of logic circuits such as a clock driver, an excessively large load rounds its output waveform, resulting in increase of time required for signal transmission. In order to reduce the time for signal transmission by driving this large output load at a high speed, a composite circuit provided with a bipolar transistor having a high current driving capability has been used in the output stage of a large load (output load) logic circuit in recent years. A configuration of such a composite circuit will be described in the following.

FIG. 18 is a diagram showing a conventional semiconductor logic circuit, illustrating an inverter gate for inverting an input signal. In FIG. 18, the inverter gate includes a p channel MOS transistor 1 and an n channel MOS transistor 2 connected in a complimentary fashion between a first power supply potential Vdd and second power supply potential Vss. The gates of MOS transistors 1 and 2 are connected to an input signal line 11. The drains of MOS transistors 1 and 2 are connected to an output signal line 12. The inverter gale shown FIG. 18 is a CMOS inverter circuit which does not include a bipolar transistor, but is illustrated for the purpose of comparison to other composite circuits. The operation will be briefly described.

With an input potential Vin applied on input signal line 11 being low (normally it is at the level of low power supply potential Vss, and is often assumed to be at the level of ground potential GND), p channel transistor 1 is conductive, and n channel MOS transistor 2 is turned off. Output signal line 12 is charged from first power supply potential Vdd through p channel MOS transistor 1, and the output potential Vout of output signal line 12 is pulled up to a high level. The output potential Vout is usually at the level of first power supply potential Vdd.

With the input potential Vin being high, p channel MOS transistor is turned off, and n channel MOS transistor 2 is conductive so that output signal line 12 is discharged to second power supply potential Vss through the conducting n channel MOS transistor. Thus, the output potential Vout decreases to a low potential (the level potential Vss). In other words, the output potential Vout becomes a potential in a logic inverted to the input potential Vin.

FIG. 19 is a diagram showing a configuration on a conventional semiconductor logic circuit called a BiNMOS gate. In FIG. 19, the BiNMOS gate includes a p channel MOS transistor 1 and an n channel MOS transistor 2 connected in a complimentary fashion between first power supply potential Vdd and second power supply potential Vss, a resistor 4 connected between one conduction terminal (drain) of p channel MOS transistor 1 and output signal lines 12, and npn bipolar transistor 3 having its collector connected to first power supply potential Vdd, its emitter connected to output signal line 12, and its base connected to the one conduction terminal (drain) of p channel MOS transistor 1. The BiNMOS gate charges output signal line 12 through bipolar transistor 3, and discharges output signal line 12 through n channel MOS transistor 2. The operation thereof will be described.

With an input potential Vin on input signal line 11 being low, p channel MOS transistor 1 is conductive, while n channel MOS transistor 2 is turned off. A base current is supplied to the base of npn bipolar transistor 3 through the conductive p channel MOS transistor 1. Also at that time, current flows to resistor 4 through p channel MOS transistor 1, and the potential difference across resistor 4 provides a base-emitter voltage (about 0.5 V) necessary for turning on npn bipolar transistor 3. When the base-emitter region of bipolar transistor 3 is biased in the forward direction due to the potential difference at resistor 4, bipolar transistor 3 conducts. Npn bipolar transistor 3 supplies an emitter current as large as the current amplification factor times (usually about 100 times) the base current. This pulls up the output potential Vout at a higher speed as compared to the configuration of the CMOS inverter gate shown in FIG. 18.

The high potential of the output potential Vout is ultimately charged to the level of the power supply potential Vdd through p channel MOS transistor 1 and resistor 4.

With the input potential Vin being high, p channel MOS transistor 1 is turned off, and bipolar transistor 3 is also turned off, while n channel MOS transistor 2 conducts. Output signal line 12, as is the case with the CMOS inverter gate shown in FIG. 18, is discharged to the level of the second power supply potential Vss through n channel MOS transistor 2.

FIG. 20 is a diagram showing another configuration of a conventional semiconductor logic circuit. The semiconductor logic circuit shown in FIG. 20 includes, in addition to the configuration shown in FIG. 19, an n channel MOS transistor 5 connected between the base of npn bipolar transistor 3 and the second power supply potential Vss, a resistor 6 connected between n channel MOS transistor 2 and the second power supply potential Vss, and an npn bipolar transistor 7 connected between output signal line 12 and the second power supply potential Vss. The input potential Vin is applied to the gate of n channel MOS transistor 5. Npn bipolar transistor 7 has its collector connected to output signal line 12, its emitter connected to the second power supply potential Vss, and its base connected to the connection node of MOS transistor 2 and resistor 6. Resistor 6 is provided for applying the base-emitter voltage of npn bipolar transistor 7.

The semiconductor logic circuit shown in FIG. 20 charges/discharges through npn bipolar transistors 3 and 7, and is generally referred to as a BiCMOS gate. Its operation will be described in the following.

With the input potential Vin being low, p channel MOS transistor 1 is made conductive, while n channel MOS transistors 2 and 5 are turned off. In this case, as in the case with the BiNMOS gate shown in FIG. 19, a base current is supplied to the base of npn bipolar transistor 3 through MOS transistor 1, and bipolar transistor 3 having its base-emitter region forward-biased by resistor 4 conducts. Thus, output signal line 12 is charged at a high speed through bipolar transistor 3.

With the input potential Vin being high, n channel MOS transistors 2 and 5 are conductive and p channel MOS transistors 1 is turned off. In this case, the base current is supplied to the base of npn bipolar transistor 7 through output signal line 12, and bipolar transistor 7 has its base-emitter region forward-biased by resistor 6 and conducts. Thus, output signal line 12 is discharged at a high speed by the collector current of bipolar transistor 7. In the case of the BiCMOS gate shown in FIG. 20, the output potential Vout is pulled up at a higher speed compared to the BiNMOS gate shown in FIG. 19 accordingly.

When the output potential Vout is decreased, npn bipolar transistor 3 must be turned off at a high speed in order to cut off the charging of output signal 12 by npn bipolar transistor 3. N channel MOS transistor 5 is provided for this purpose. More specifically, n channel MOS transistor 5 is made conductive when the input voltage Vin changes its level from low to high, and extracts the base charges of npn bipolar transistor 3, turning off npn bipolar transistor 3 at a high speed.

FIG. 21 is a diagram showing another configuration of a conventional semiconductor logic circuit. In FIG. 21, the conventional semiconductor logic circuit includes p channel MOS transistors 1 and n channel MOS transistor 2 connected in a complimentary fashion between a first power supply potential Vdd and a second power supply potential Vss, a resistor 4 between p channel MOS transistor 1 and output signal line 11, a resistor 8 connected between output signal line 12 and n channel MOS transistor 2, an npn bipolar transistor 3 provided between the first power supply potential Vdd and output signal line 12, and a pnp bipolar transistor 9 connected between output signal line 12 and the second power supply potential Vss.

An input potential Vin is applied to the gates of p channel MOS transistor 1 and n channel MOS transistor 2. Npn bipolar transistor 3 has its collector connected to the first power supply potential Vdd, its emitter connected to output signal line 12, and its base connected to the common connection node of transistor 1 and resistor 4. Pnp bipolar transistor 9 has its emitter connected to output signal line 12, its collector connected to the second power supply potentials Vss, and its base connected to the common connection node of resistor 8 and transistor 2.

The semiconductor logic circuit shown in FIG. 21 charges output signal line 12 through npn bipolar transistor 3, while discharges output signal line 12 through pnp transistor 9 and is generally referred to as a CBiC-MOS gate. Its operation will be described in the following.

When the input potential Vin is pulled down from high to low, p channel MOS transistor 1 is on while n channel MOS transistor 2 is turned off. Thus, a base current is supplied to npn bipolar transistor 3 through p channel MOS transistor 1, and output signal line 12 is charged at a high speed by the emitter current of this npn bipolar transistor 9, thus pulling up the output potential Vout at a high speed.

With the input potential Vin being pulled up from low to high, p channel MOS transistor 1 is turned off while n channel MOS transistor 2 is turned on. Thus, pnp bipolar transistor 9 has its base-emitter region forward-biased by resistor 8, and its base current is extracted at a high speed through n channel MOS transistor 2. This causes pnp bipolar transistor 9 to conduct at a high speed, pulling down the potential Vout of output signal line 12 at a high speed by its emitter current.

The configuration of the CBiCMOS gate shown in FIG. 21 permits reduction of elements as compared to the configuration of the BiCMOS gate shown in FIG. 20, because n channel MOS transistor 5 is not necessary.

As described above, a large load can be driven at a high speed by charging/discharging the out signal line 12, using a bipolar transistor having a large current driving capability. The following problem is however encountered when the output signal line is charged or discharged using the configurations of the composite circuits (a circuit including a bipolar transistor and an MOS transistor) shown in FIGS. 19 to 21.

When output signal line 12 is charged through a bipolar transistor, if the difference between the first power supply potential Vdd and the output potential Vout is smaller than a base-emitter voltage (Vbe: usually about 0.8 V) which is necessary for bipolar transistor 3 to conduct, the bipolar transistor is turned off. Therefore, if the output potential Vout is higher than Vdd minus Vbe, bipolar transistor 3 for charging the output signal line 12 attains the non-conduction state, output signal line 12 is charged by p channel MOS transistor 1 through a resistor (resistor 4 in FIGS. 19 to 21). The current driving capability of p channel MOS transistor 1 is smaller than that of bipolar transistor 3. The speed of pulling up of the output potential Vout rapidly decreases. Especially in the cases of the semiconductor logic circuits shown in FIGS. 20 and 21, in the potential amplitude of output signal line 12, in the upper side Vbe region (the region covering the first power supply potential Vdd to Vdd−Vbe) and the lower side Vbe (the region covering the second power supply potential Vss to Vss+Vbe), the bipolar transistor does not conduct. The state is shown in FIG. 22.

In FIG. 22, the lateral axis represents time, and longitudinal axis potential. Referring to FIG. 22, the region I represents the region of the upper Vbe, which is the region in which the bipolar transistor for charging output signal line 12 is turned off. The region II represents the region of the lower Vbe, which is the region in which the bipolar transistor for discharging output signal line 12 is turned off. As can be seen from FIG. 22, the presence of the region in which the bipolar transistor is turned off in each of the upper and lower sides of Vbe gives rise to a serious problem as the power supply voltage Vdd decreases.

The breakdown voltage of an MOS transistor decreases as a function of the down-scaling, and, therefore, a voltage applied across its source-drain region should be reduced. The power supply voltage Vdd should be reduced accordingly. In that case, the base-to-emitter voltage Vbe of a bipolar transistor is a constant value not subjected to the scaling, and, therefore, the magnitude of the above-stated 2·Vbe (the sum of the upper Vbe and lower Vbe) with respect to the power supply voltage becomes relatively large. The bipolar transistor is in the state of non-conduction in this region, and the superior quality (high speed operation property) of the BiCMOS gate or CBiCMOS gate to a CMOS gate is lost. More specifically, with low voltage supply, a BiCMOS circuit or a CBiCMOS circuit greatly deteriorates in high speed performance.

Two approaches have been suggested for such deterioration in high speed performance under a low supply voltage operating condition as in the following.

FIG. 23 illustrates the circuit configuration disclosed by C. L. Chen in the 1990 ISSCC (International Solid-State Circuits Conference) (see Technical Digest of 1990ISSCC, pp. 236–237).

The circuit shown in FIG. 23 includes an input stage 20 for receiving an input signal Vin and restricting its logic amplitude to output, a BiCMOS driver 21 for executing a prescribed logic operational processing on the signal from input stage 20, and an output stage 22 for receiving the output from BiCMOS driver 21 and applying a prescribed logic processing to the received output to output as an output potential Vout.

Input stage 20 includes a p channel MOS transistor 22 and an n channel MOS transistor 23 connected in a complimentary fashion for receiving the input potential Vin at their gates, a diode 21 connected between p channel MOS transistor 22 and a first power supply potential Vdd, and a diode 24 connected between n channel MOS transistor 23 and a second power supply potential Vss. Diodes 21 is connected in the forward direction between the first power supply potential Vdd and p channel MOS transistor 22. Diodes 24 is connected in the forward direction between n channel MOS transistor 23 and the second power supply potential Vss.

The substrate of p channel MOS transistor 22 is connected to the first power supply potential Vdd, while the substrate of n channel MOS transistor 23 is connected to the second power supply potential Vss. Input stage 20 is a CMOS inverter gate, and a logically inverted signal of the input potential Vin is output to a node N1. A high potential Vh appearing at node N1 is at the level of "Vdd−Vf", while a low potential Vl at node N1 is at the level of "Vss+Vf". Vf is the forward voltage of diodes 21 and 24, which is equal to the base-emitter voltage Vbe of the bipolar transistor if PN diodes are used for diodes 21 and 24.

Driver 21 at the intermediate stage is given its operation power supply potential by the power supply potentials Vdd and Vss, processes an output signal from the node N1 of input stage 20, and applies the processed signal to the node N2 of output stage 22. BiCMOS driver 21 includes a bipolar transistor and a CMOS transistor, and the logical amplitude of the input signal is given by "Vdd−Vf−Vf=Vdd−2·Vf." In this case, in BiCMOS driver 21, the high potential of the input signal is provided by Vdd−Vbe, while the low potential by Vbe (assuming that the second power supply potential Vss is ground potential GND), and therefore, the output potential is Vdd−Vbe at its high level and Vbe at its low level. In this case, the regions I and II shown in FIG. 22 are omitted from the logic amplitude, the bipolar transistor provided at the output of BiCMOS driver 21 conducts in the entire logic amplitude region, and the output is charged/discharged at a high speed.

Output stage 22 has a similar structure to input stage 20, and includes a diode 31, a p channel MOS transistor 32, an n channel MOS transistor 33 and a diode 34. The structure of output stage 22 renders the logic amplitude smaller than the power supply voltage Vdd by 2·Vf due to the presence of diodes 31 and 34.

More specifically, according to the structure shown in FIG. 23, the logic amplitude of an output signal from the BiCMOS circuit is matched to the level of the CMOS power supply voltage at output stage 22. The circuit configuration shown in FIG. 23 includes a circuit for level shift at the input and output of BiCMOS driver 21, and achieves the high speed operation by reducing its logic amplitude and constantly driving the bipolar transistors.

The circuit configuration of the level shift shown in FIG. 23, however, causes a backgate effect, because a diode is connected to the source of each MOS transistor in the CMOS gates of input stage 20 and output stage 22. In p channel MOS transistors 22 and 32, for example, the source potentials each become Vdd−Vf through diodes 21 and 31, while the substrate potentials each become Vdd. Thus, the substrate potentials of p channel MOS transistors 22 and 32 are biased relative to the sources by the amount of Vf, lowering the threshold voltages. Similarly in n channel MOS transistors 23 and 33, the difference between the system potential and substrate potential is provided by the amount of the forward voltage Vf of diodes 24 and 34, thus similarly increasing the threshold voltage. Current flowing through the MOS transistors decreases, and signal delay time tremendously increases as a result because a long period of time is required for charging/discharging nodes N1 and N3.

In the CMOS gate (output stage 22 and input-stage 20), in its steady state, either p channel MOS transistor (22 or 32) or n channel MOS transistor (23 or 33) is turned off, and no current path is therefore formed from the first power supply potential Vdd to the second power supply potential Vss. Current does not flow through diodes 21, 24 or diodes 31, 34 in the steady state, and, therefore, shift of the forward voltage Vf cannot be ensured.

Especially in output stage 22 in its steady state, the gate-source voltage of p channel MOS transistor 32 or n channel MOS transistor 33 becomes 0 V, and current does not flow to diodes 31 and 34 as a result. This keeps the forward voltage drop function of the diode from being fully effected, and it is therefore difficult to stably maintain its logic amplitude at the Vdd−Vf level.

FIG. 24 shows the structure of a BiCMOS circuit suggested together with the circuit structure shown in FIG. 23. Although a structure of 2 input NAND gate is illustrated in the above-stated document, a structure of an inverter gate will be described herein for the purpose of simplification. In FIG. 24, the BiCMOS gate includes at its input portion a structure similar to input stage 20 shown in FIG. 23. More specifically, the gate includes a p channel MOS transistor 41 and an n channel MOS transistor 42 connected in a complementary fashion between nodes N10 and N11, a diode 45 connected between node N10 and a first power supply potential Vdd, and a diode 46 connected between node Nil and a second power supply potential Vss.

The BiCMOS gate further includes an n channel MOS transistor 47 having its one conduction terminal (drain) connected to output signal line 12, its gate connected to input signal lines 11 and its source connected to the base of an npn bipolar transistor 49; an n channel MOS transistor 48 having its one conduction terminal (drain) connected to the other conduction terminal (source) of n channel MOS transistor 47 and the base of npn bipolar transistor 49, its the other conduction terminal (source) connected to node N11, and its gate connected to one conduction terminal (drain) of p channel MOS transistor 41; npn bipolar transistor 49 having its collector connected to output signal line 12, its emitter connected to the second power supply potential Vss, and its base connected to the other conduction terminal (source) of n channel MOS transistor 47; an npn bipolar transistor 43 having its collector connected to node N10, its emitter connected to output signal line 12, and its base connected to one conduction terminal (drain) of p channel MOS transistor 41 and the gate of n channel MOS transistor 48; and a p channel MOS transistor 44 having its one conduction terminal connected to node N10, its gate connected to input signal line 11, and its other conduction terminal connected to output signal line 12.

Now, the operation of the BiCMOS gate shown in FIG. 24 will be described.

With the input potential Vin being high, p channel MOS transistors 41 and 44 are turned off, while n channel MOS transistors 42 and 47 are conducting. Bipolar transistor 43 has its base current extracted through transistor 42 and is turned off at a high speed. Bipolar transistor 49 is turned on at a high speed and thus pulls down the output potential Vout of output signal line 12 because the base current of transistor 49 is supplied from signal line 12 through the conducting MOS transistor 47, and its base-emitter region is biased by diode 46.

With the input potential Vin being low, MOS transistors 42 and 47 are turned off, while p channel MOS transistors 41 and 44 conduct. Thus, base current is supplied to the base of bipolar transistor 43, turning on bipolar transistor 43 and charging signal line 12 at a high speed.

At that time, MOS transistor 48 conducts as well and extracts the base charges of bipolar transistor 49 at a high speed, turning off bipolar transistor 49. Thus, the output potential Vout of output signal line 12 is charged at a high speed. The base potential of bipolar transistor 43 is pulled up to Vdd−Vf at the maximum, and, therefore, the output potential Vout on output signal line 12 will be Vdd−Vf−Vbe=Vdd−2·Vf=Vdd−2·Vbe only with the provision of bipolar transistor 43 due to its emitter follower operation.

P channel MOS transistor 44 is therefore provided and drives the output potential Vout on output signal line 12 to the level of the potential Vdd−Vf (=Vdd−Vbe) of node N10.

In the case of the structure shown in FIG. 17, bipolar transistor 43 will not further pull up the potential of output signal line 12 once the potential of output signal line 12 reaches the level of Vdd−2·Vbe, and therefore, p channel MOS transistor 44 is used for driving the output potential Vout from the potential Vdd−2·Vbe to Vdd−Vbe. This creates the region in which the bipolar transistor does not operate, and the high speed performance property is lost.

FIG. 25 illustrates the structure of the CBiCMOS gate presented together with the circuits shown in FIGS. 22 and 23. A structure of 2 input gate circuit is also shown in the previously-stated document, but a structure of an inverter gate is instead shown in FIG. 25 for the purpose of simplification. Referring to FIG. 25, the CBiCMOS gate circuit includes a p channel MOS transistor 51 and an n channel MOS transistor 52 connected in a complimentary manner between nodes N21 and N22, a p channel MOS transistor 53 placed between nodes N23 and N21, a diode 55 placed between a first power supply potential Vdd and node N23, an n channel MOS transistor 54 placed between nodes N22 and N24, and a diode 56 placed between node N24 and a second power supply potential Vss.

The gates of p channel MOS transistor 51 and n channel MOS transistor 52 are provided with an input potential Vin. P channel MOS transistor 53 and n channel MOS transistor 54 have their gates connected to output signal line 12. Diodes 55 supplies a potential Vdd−Vf to node N23. Diode 56 supplies a potential Vss+Vf (=Vf) to node N24.

The CBiCMOS gate circuit further includes a pnp bipolar transistor 57 having its emitter connected to the first power supply potential Vdd, its collector connected to output signal line 12, and its base connected to node N21, and an npn bipolar transistor 58 having its collector connected to output signal lines 12, its emitter connected to the second power supply potential Vss, and its base connected to node N22. The operation will be briefly described.

With the input potential Vin being low, p channel MOS transistor 51 conducts, while n channel MOS transistor 52 is turned off. Thus, base charges are extracted from the base of pnp bipolar transistor 52, output signal line 12 is charged at a high speed through pnp bipolar transistor 52, pulling up the output potential Vout. The pull up potential is applied to the gates of n channel MOS transistor 54 and p channel MOS transistor 53, thus turning off p channel MOS transistor 53, and turning on n channel MOS transistor 54. Consequently, bipolar transistor 58 has its base charges extracted through transistor 54, and is turned off at a high speed, whereby output signal line 12 is charged through bipolar transistor 57.

With the input potential Vin being high, p channel MOS transistor 51 is turned off, while n channel MOS transistor 52 conducts. Thus, base current is supplied to the base of bipolar transistor 58, bipolar transistor 58 conducts, the charges are extracted from output signal line 12 at a high speed, and the output potential Vout is pulled down. As the potential Vout of output signal line 12 decreases, p channel MOS transistor 53 conducts, and base current is supplied to bipolar transistor 57, turning off bipolar transistor 57 at a high speed. Thus, output signal line 12 is charged at a high speed through bipolar transistor 58, and the output potential Vout decreases.

In the structure of the CBiCMOS gate circuit shown in FIG. 25, the emitter potential of pnp bipolar transistor 57 is offset by the amount of potential Vbe+the potential of node N23, while the emitter potential of npn bipolar transistor 58 is offset by the sum of Vbe and the potential of node N24. In the circuit structure shown in FIG. 25, reduction of the potential Vbe by bipolar transistors 57 and 58 permits the output potential Vout to be the potential of node N23 or N24.

However, in the case of structure of the CBiCMOS gate circuit shown in FIG. 25, bipolar transistors 57 and 58 for output are used in the emitter ground configuration. The collector-base junction of a bipolar transistor does not possess a potential clamping capability unlike the base-emitter junction. Therefore, the output potential Vout is not always offset by the amount of the base-emitter voltage Vbe from the respective power supply potentials Vdd and Vss in the steady state (the state in which the output potential Vout is stable).

In the case of circuit structures shown in FIGS. 24 and 25, as is the case with the circuit structure shown in FIG. 23, the source of MOS transistor is connected to a diode which is connected to the power supply potential Vdd or Vss, and the backgate effect prevails due to this structure, decreasing the amount of current flowing through the MOS transistor, thus greatly increasing signal delay time.

Also in the steady state, the voltage applied to the gate-source region of p channel MOS transistor 53 or n channel MOS transistor 54 is 0 V, no current flows through diode 55 or diode 56 as a result, and, therefore, it is difficult to stably set the logic amplitude of the output signal at Vdd−2·Vbe.

FIG. 26 is a diagram showing a circuit structure for improving the low voltage speed performance of a conventional BiCMOS gate circuit. The circuit structure shown in FIG. 26 is presented by HIRAKI et al., in Proceedings 1990 Spring National Conference of institute of Electronics, Information, Communications and Electrics Engineers of Japan, p. 5–189. The BiCMOS gate circuit shown in FIG. 26 includes a p channel MOS transistor having its one conduction terminal (source) connected to the first power supply potential Vdd, its gate connected to an input signal line 11, and its other conduction terminal (drain) connected to a node N31; a diode 63 connected in the forward direction between nodes N31 and N33; an n channel MOS transistor 62 having its one conduction terminal (drain) connected to node N33, its other conduction terminal (source) connected to a reference potential Vr, and its gate connected to input signal line 11; a resistor 64 connected between node N33 and output signal line 12; and an npn bipolar transistor 65 having its collector connected to the first power supply potential Vdd, its emitter connected to output signal line 12, and its base connected to node N31. The forward voltage Vf of diode 63 is set to be a value smaller than the base-emitter voltage Vbe of bipolar transistor 65 (about 0.5 V). The reference voltage Vr is set to be the value which satisfies the relation represented by Vr=Vf and Vdd=Vh+2·Vr provided that the logic amplitude of an input signal potential Vin is Vh.

The BiCMOS gate circuit shown in FIG. 26 further includes an n channel MOS transistor 66 having its one conduction terminal (drain) connected to output signal line 12, its gate connected to input signal line, and its other conduction terminal (source) connected to the reference potential Vr through resistor 67, and an npn bipolar transistor 68 having its collector connected to output signal line 12, its base connected to node N32, and its emitter connected to the second power supply potential Vss. The second power supply potential Vss is usually selected to be ground potential VGND. The operation will be briefly described in the following.

With the input signal potential Vin being high, n channel MOS transistors 62 and 66 conduct, whereby bipolar transistor 65 has its base charges extracted and attains the non-conduction state. Bipolar transistor 68 is supplied with base current from signal line 12 through MOS transistor 66 and conducts, thus lowering the potential of output signal line 12 at a high speed. The base potential of bipolar transistor 68 is biased by the reference potential Vr. The potential of output signal line 12 is therefore ultimately pulled down to the level of Vss+Vbe.

With the input signal potential Vin being low, p channel MOS transistor 61 conducts while n channel MOS transistors 62 and 66 are turned off. In this case, npn bipolar transistor 65 conducts, bipolar transistor 68 is turned off, and output signal line 12 is charged through this npn bipolar transistor 65. The charge potential of output signal line 12 finally reaches the level of Vdd−Vbe.

In the case of the circuit structure shown in FIG. 26, in addition to the power supply voltages Vdd and Vss, a certain reference potential Vr should be supplied externally. In this case, the reference potential Vr can be supplied using a diode-connected MOS transistor, but this approach increases the number of elements for forming the circuit.

The BiCMOS logic circuit is usually used with a logic circuit structured exclusively of CMOS transistor circuitry. In this case, the logic circuit formed exclusively of CMOS transistors is provided at the next stage of the BiCMOS logic circuit. However, in the case of the circuit structure shown in FIG. 26, no approach is provided for reducing the logic amplitude in the CMOS logic circuit provided in the next stage. More specifically, the prior art document simply discloses the step of increasing the first power supply potential Vdd of BiCMOS gate circuit to the level of Vcc+2·Vf when the logic amplitudes of the input signal Vin and the output signal potential Vout are both at the level of Vcc (power supply potential for the operation of the logic circuit), and with the reference potential Vr being set to be approximately identical to the forward voltage Vf of the diode. In this case, in addition to the reference potential Vr, another power supply potential will be necessary as a power supply potential for the operation of the BiCMOS gate circuit.

SUMMARY OF THE INVENTION

It is an object of the present invention to provide a semiconductor logic circuit without the defects of a conventional semiconductor logic circuit as stated above, and without the degradation in high speed performance when driven by a low power supply voltage.

Another object of the present invention is to provide a semiconductor logic circuit which can operate at a high speed with a reduced logic amplitude without increase of signal delay time in a semiconductor logic circuit formed exclusively of CMOS transistors.

A further object of the present invention is to provide a semiconductor logic circuit in the output stage of a composite logic circuit including bipolar transistors which can operate at a high speed without requiring a potential other than a power supply potential.

Yet another object of the present invention is to provide a semiconductor logic circuit in which the entire region of its logic amplitude can be driven by bipolar transistors included in its output stage and its output logic amplitude can be constantly and surely determined.

Further object of the present invention is to provide a semiconductor logic circuit whose output amplitude can be equalized to any logic circuit of CMOS, BiC-MOS, and CMOS structures.

In a semiconductor logic circuit in accordance with the present invention, the logic amplitudes of an input signal and an output signal are set to be Vdd−2·Vf by connecting a first diode for charging an output node and a diode for discharging the output node in series with respect to the output node and by applying very small current through the diodes even in the steady state.

The semiconductor logic circuit of the invention includes an input stage to which an amplitude-limited logic signal is input, and from which the input logic signal subjected to a prescribed logical operational processing is output to a prescribed node.

The input stage includes a field effect transistor of first type conductivity supplied with current from a first power supply potential for charging the above-described prescribed node to a first potential in response to the input signal, and a first diode element connected between the field effect transistor of the first type conductivity and the prescribed node. The first diode element has a first forward voltage, and lowers the first potential of prescribed node from the level of the first power supply potential by the amount of the first forward voltage.

The input stage further includes a field effect transistor of second type conductivity supplied with current from a second power supply potential for discharging the above-described prescribed node to a second potential in response to the abode-stated input signal, and a second diode element connected between the field effect transistor of the second type conductivity and the node. The second diode element has a second forward voltage and sets the second potential higher than the second power supply potential by the amount of the second forward voltage.

A semiconductor logic circuit in accordance with another aspect of the present invention includes an output stage formed of a complimentary field effect transistor, and an output stage including a bipolar transistor. The input stage includes a field effect transistor of a first type conductivity supplied with current from a first power supply potential for charging a first node to a first potential in response to an input signal, a first diode element connected between the field effect transistor the first type conductivity and the first node, a field effect transistor of second type conductivity supplied with current from a second power supply potential for discharging the first node to a second potential in response to the input signal, and a second diode element connected between the first node and the field effect transistor of the second type conductivity.

The first and second diode elements have first and second forward voltages, respectively. The input signals applied to the field effect transistor of the first type conductivity and the field effect transistor of the second type conductivity have their logic amplitudes set smaller than the difference between the first power supply potential and the second power supply potential so that current flows through the first and second field effect transistors in their steady state.

The output stage is driven by the output signal of the input stage and charges/discharges the output node. The output stage is provided between the first power supply potential and the output node, and includes a bipolar transistor for charging the output node in response to the output signal of the first field effect transistor.

According to the former aspect, the source-gate voltages of the first and second field effect transistors are higher than a conventional circuit, and, therefore, larger drain current can be supplied, thus enabling high speed operation. Small current flow is also supplied at that time to the first and second field effect transistors in their steady states, the logic amplitude of the output signal can stably be reduced by the first and second diode elements.

According to the latter aspect of the present invention, the signal with its logic amplitude reduced is stably and surely output from the input stage, and therefore, the bipolar transistors of the output stage become operable over the entire region of the signal amplitude, thus enabling high speed driving of the output signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
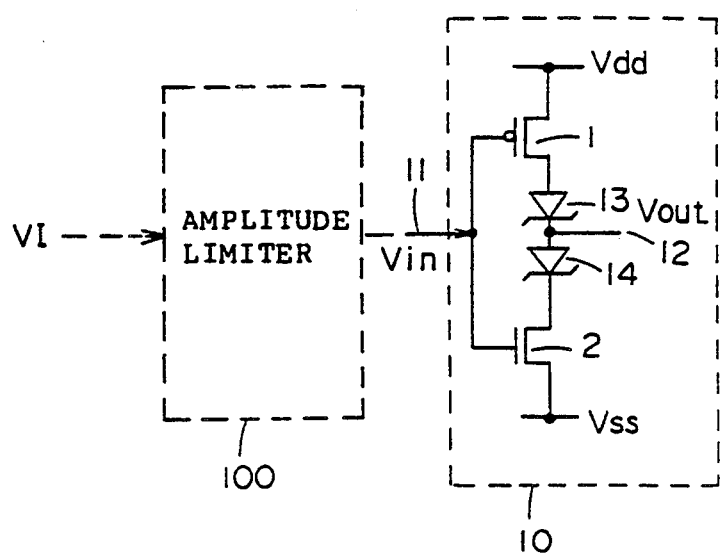
FIG. 1 is a diagram showing a structure of a semiconductor logic circuit in accordance with one embodiment of the present invention.

FIG. 1 is a diagram showing a structure of a semiconductor logic circuit in accordance with one embodiment of the present invention. The semiconductor logic circuit shown in FIG. 1 includes a CMOS inverter gate. The amplitude of an input signal Vin applied onto the input signal line 11 of a semiconductor logic circuit 10 is limited. The input signal Vin may be a signal of ECL level, for example, and may be converted into a signal of CMOS level by semiconductor logic circuit 10.

Figure 24:
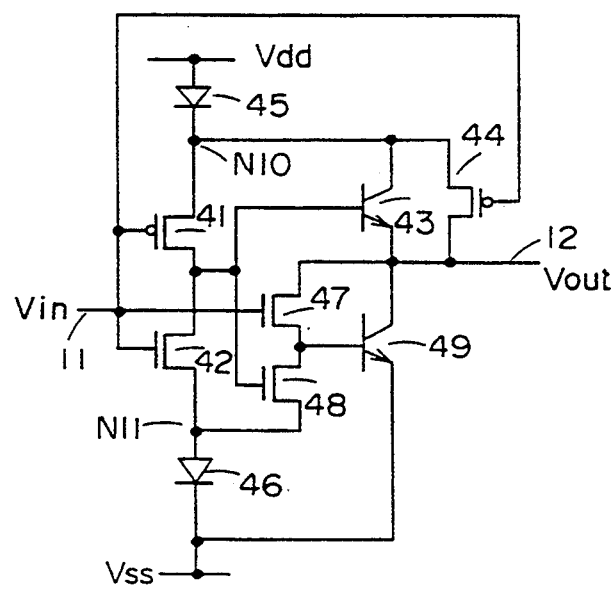
FIG. 24 is a diagram showing another structure of a conventional semiconductor logic circuit which reduces its logic amplitude.
Figure 25:
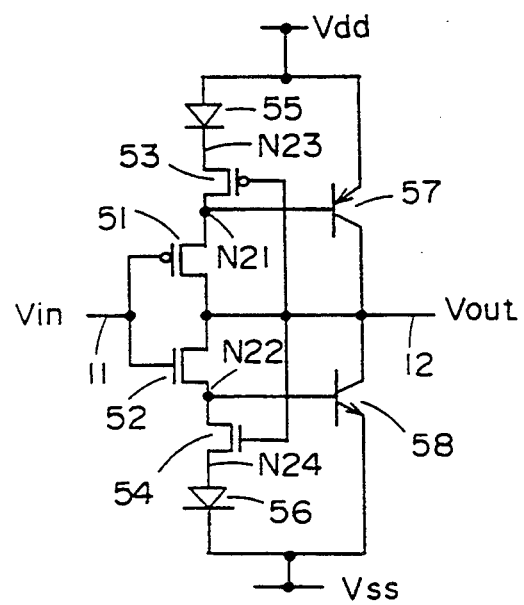
FIG. 25 is a diagram showing a further structure of a conventional semiconductor logic circuit which reduces its logic amplitude.
Figure 26:
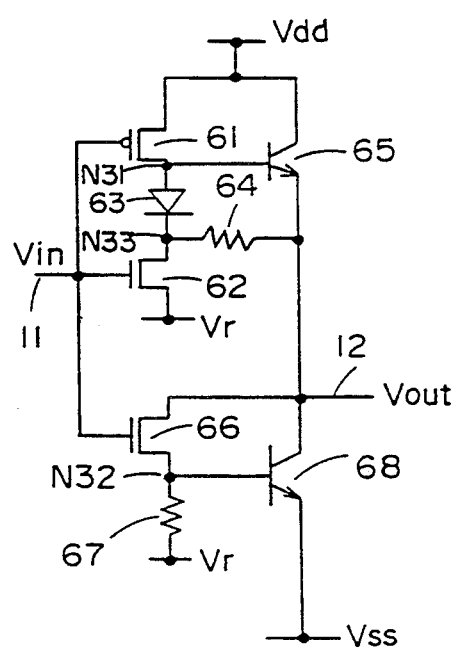
FIG. 26 is a diagram showing yet another structure of a conventional semiconductor logic circuit which reduces its logic amplitude.

As in the structure shown in FIG. 1, an input signal VI may have its amplitude limited by amplitude limiting circuit 100 and the input signal Vin may be outputted. The circuit structures shown in FIGS. 24 and 25 may be used for a structure of amplitude limiting circuit 10 even though the circuit is with the problem of its logic amplitude reduction being a little unstable. Other clipper circuits may be used. An improved amplitude limiter will be discussed later in detail.

Referring to FIG. 1, semiconductor logic circuit 10 includes a p channel MOS transistor 1 responsive to an input signal potential Vin applied onto input signal line 11 for charging an output signal line 12 to a high potential, a diode 13 provided in the forward direction between p channel MOS transistor 1 and output signal line 12, an n channel MOS transistor 2 responsive to the input signal potential Vin on input signal line 11 for discharging output signal line 12, and a diode 14 connected in the forward direction between output signal line 12 and n channel MOS transistor 2.

P channel MOS transistor 1 is supplied with current from a first power supply potential Vdd, and charges output signal line 12 to a high potential when the input signal potential Vin is at the level of low potential. N channel MOS transistor 2 is supplied with current from a second power supply potential Vss (usually ground potential GND, which will hereinafter be simply referred to as 0 V), and discharges output signal line 12 when the input signal potential Vin is high.

The input signal potential Vin has its high potential side and the low potential side amplitude-limited to Vdd−Vf and Vf, respectively. Vf is forward voltage drop of diodes 13 and 14. The forward voltage Vf is equal to the base-emitter voltage Vbe of a bipolar transistor and about 0.8 V when diodes 3 and 4 are pn diodes. The operation will be described.

When the input signal potential Vin changes its level from low to high, n channel MOS transistor 2 conducts as is the case with a conventional CMOS gate. Output signal line 12 is discharged by the drain current of n channel MOS transistor 2, and its potential decreases. In the following description, the source terminal of the MOS transistor is described as a conduction terminal connected to the power supply potential Vdd or Vss.

The input signal potential Vin at the level of Vdd−Vf is applied to the gate of p channel MOS transistor 1, and its source is supplied with the first power supply potential Vdd. Therefore, the voltage Vf is applied across the source-gate region of p channel MOS transistor 1. As is well known, when an MOS transistor is supplied with a voltage (which is shown as Vgs) across its gate-source region, a drain current flows therethrough. When the threshold voltage of the MOS transistor (the voltage by which an inversion layer is formed in the channel region of the MOS transistor) is represented by Vth, a linear region (triode region) current in proportion to (Vgs−Vth)·Vds flows, provided that $|Vgs| > |Vth|$ holds.

If $0 < |Vgs| < |Vth|$ holds, subthreshold current flows. Vds represents a voltage applied between the source and the drain of the MOS transistor.

The subthreshold current is smaller than the linear region (triode region) current. Regardless which is larger between the voltage Vgs and the threshold voltage Vth, current flows through p channel MOS transistor 1.

The current through p channel MOS transistor 1 flows into n channel MOS transistor 2 through diodes 13 and 14 connected in series. With the current constantly flowing through diodes 13, 14, a high potential higher than the drain potential of n channel MOS transistor 2 by the amount of the forward voltage Vf is stably output to output signal line 12.

The drain potential of n channel MOS transistor 2 is finally pulled down to the second power supply potential Vss, in other words the ground potential, and, therefore, the lowest voltage of output signal line 12 is stably 0.8 V (=Vf).

When the input signal potential Vin changes its level from a high potential to a low potential, the p channel MOS transistor conducts, output signal line 12 is charged by the drain current of p channel MOS transistor 1, and the potential increases. The input signal potential Vin at its low level is Vf. The potential of Vf is at least applied across the gate-source region of n channel MOS transistor 2, and n channel MOS transistor 2 is not turned off and current flows therethrough. Thus, current flows through the two diodes 13 and 14 connected in series. The output signal potential Vout of output signal line 12 is decreased from the drain potential of p channel MOS transistor 1 by the amount of the forward voltage Vf of diode 13. The output signal potential Vout ultimately only increases to the level lower than the first power supply potential Vdd by the amount of the forward voltage Vf (about 0.8 V) of diode 13.

Figure 2:
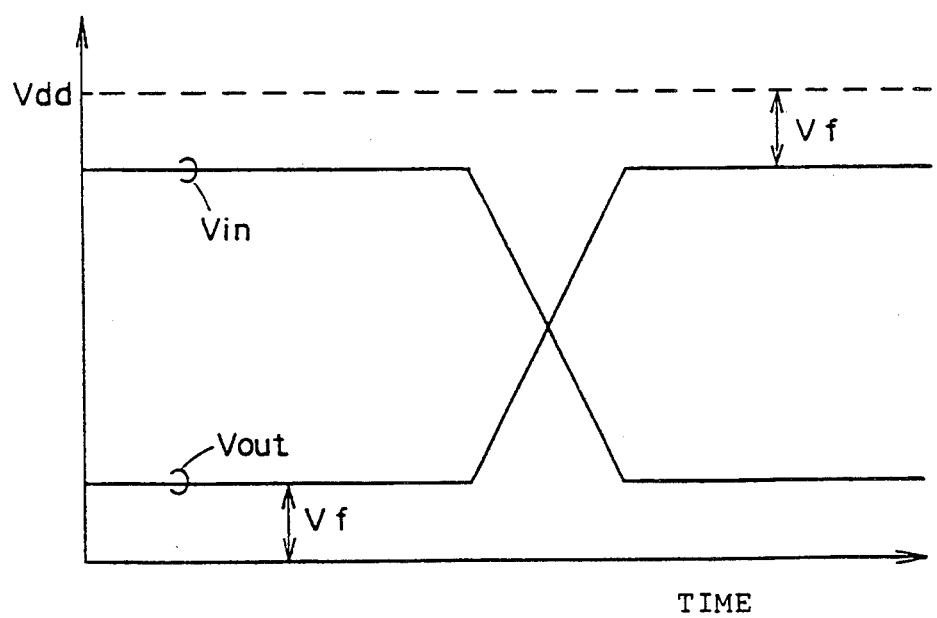
FIG. 2 is a representation showing the logic amplitudes of input and output signals to and from a semiconductor logic circuit according to the present invention.

As shown in FIG. 2, the high potential of output signal potential Vout becomes Vdd−Vf (Vdd−0.8 V) while the low potential is Vf (0.8 V) by constantly flowing current through diodes 13 and 14 as described above.

FIG. 2 is a representation showing the relation between the input signal potential Vin and the output signal potential Vout of the semiconductor logic circuit 10 shown in FIG. 1, in which the lateral axis represents time and the longitudinal axis represents potential. Using the structure shown in FIG. 1, the voltage applied across the source-drain region of p channel MOS transistor 1 and n channel MOS transistor 2 is Vdd−2·Vf at its maximum. This is because the drain potentials of MOS transistors 1 and 2 are each shifted from the output signal potential Vout by the amount of the forward voltage Vf of diodes 13 and 14. Highly integrated MOS transistor of a next generation can therefore be used with a high reliability. Also the following advantage are provided over the structure in which the power supply voltage itself is reduced to Vdd−2·Vf without using diodes.

More specifically stated, in the case of the structure of reducing the power supply voltage itself, the logic amplitude of the input signal potential Vin is determined by the power supply voltage Vdd−2·Vf, and the maximum voltage applied across the gate-source region of the MOS transistor is Vdd−2·Vf. Meanwhile, in the structure of semiconductor logic circuit 10 shown in FIG. 1, the maximum voltage applied across the gate-source region of MOS transistors 1 and 2 is Vdd−Vf. Therefore, according to the structure of the present invention, a larger drain current flows through the MOS transistors, and output signal line 12 is charged/-discharged at a high speed, thus enabling higher speed operation.

Figure 3:
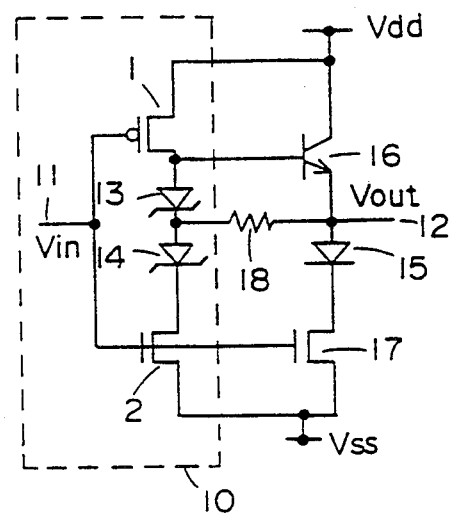
FIG. 3 is a diagram showing a structure of a semiconductor logic circuit in accordance with another embodiment of the present invention.

FIG. 3 is a diagram showing a structure of a semiconductor logic circuit in accordance with another embodiment of the present invention.

The structure shown in FIG. 3 provides a BiNMOS inverter gate circuit. Referring to FIG. 3, the semiconductor logic circuit includes a semiconductor logic circuit (CMOS inverter gate circuit) 10 shown in FIG. 1 at its input stage, and an npn bipolar transistor 16 at its output stage. The output stage includes a diode 15 and an n channel MOS transistor 17 connected in series between output signal line 12 and the second power supply potential (ground potential) Vss.

Bipolar transistor 16 has its collector connected to the first power supply potential Vdd, its emitter connected to output signal line 12, and its base connected to the drain of n channel MOS transistor 1. N channel MOS transistor 17 is supplied with the input signal potential Vin at its gate, and its source is connected to the second power supply potential Vss. Diode 15 is provided in the forward direction between output signal line 12 and n channel MOS transistor 17.

The semiconductor logic circuit shown in FIG. 3 further includes a resistor 18 provided between the node (output node) of the connection of the emitter of bipolar transistor 16 and the anode of diode 15 and the common connection node (a first node) of diodes 13 and 14. The operation will be described.

The operation of semiconductor logic circuit 10 constituting the input stage is identical to that shown in FIG. 1, and description will not be provided thereon. Current constantly flows through diodes 13 and 14, supplying the base-emitter voltage Vbe of bipolar transistor 16. Bipolar transistor 16 is constantly supplied with current flow, and, therefore the output signal potential Vout of output signal line 12 at highest only reaches the level of Vdd−Vf. In this embodiment, Vf=Vbe holds.

When the output signal potential Vout on output signal line 12 decreases, output signal line 12 is discharged through n channel MOS transistor 17. In this case, current flows from bipolar transistor 16 to diode 15, and the output potential Vout of output signal line 12 at its lowest level is therefore set to be Vf.

Resistor 18 is provided for reducing time required for charging/discharging output signal line 12 by charging output signal line 12 not only through bipolar transistor 16 but also through p channel MOS transistor 1 while by discharging output signal line 12 through n channel MOS transistors 2 and 17. The basic operation does not change with or without resistor 18. A semiconductor logic circuit having a desired operation characteristic can be provided if not for diode 14 and n channel MOS transistor 2.

Figure 4:
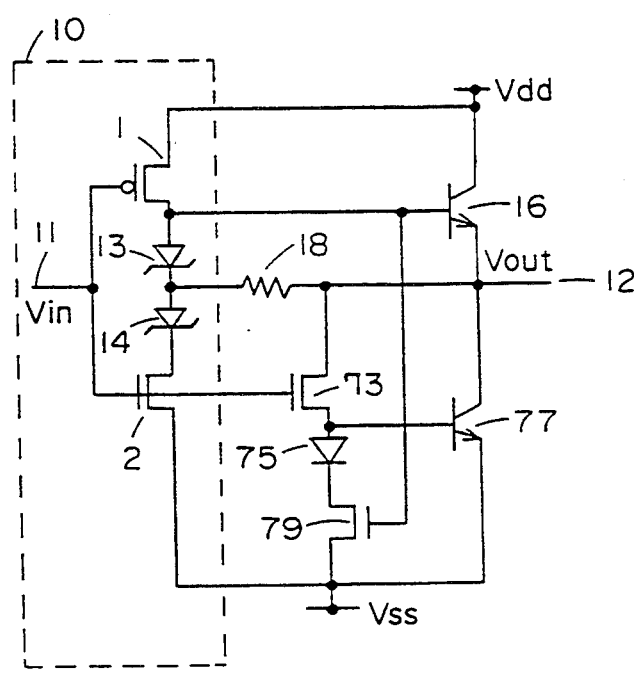
FIG. 4 is a diagram showing a structure of a semiconductor logic circuit in accordance with a further embodiment of the present invention.

FIG. 4 is a diagram showing a structure of a semiconductor logic circuit in accordance with a further embodiment of the present invention. The semiconductor logic circuit shown in FIG. 4 provides a BiCMOS inverter gate circuit. Referring to FIG. 4, the semiconductor logic circuit includes the structure of semiconductor logic circuit (CMOS inverter gate circuit) 10 shown in FIGS. 1 and 2 at its input stage. The semiconductor logic circuit shown in FIG. 4 further includes an npn bipolar transistor 16 supplied with current from the first power supply potential Vdd for charging output signal line 12, and an npn bipolar transistor 77 supplied with current from the second power supply potential Vss for discharging output signal line 12. Npn bipolar transistor 16 has its collector connected to the first power supply potential Vdd, its emitter connected to output signal line 12, and its base connected to the drain of p channel MOS transistor 1. Npn bipolar transistor 77 has its collector connected to output signal line 12, its emitter connected to the second power supply potential Vss, and its base connected to one conduction terminal (source) of n channel MOS transistor 73. N channel MOS transistor 73 has its other conduction terminal connected to output signal line 12, and its gate connected to input signal line 11. The semiconductor logic circuit shown in FIG. 4 further includes a diode 75 and an n channel MOS transistor 79 provided between n channel MOS transistor 73 and the second power supply potential Vss. N channel MOS transistor 79 has its gate connected to the base of npn bipolar transistor 16, and its one conduction terminal (source) connected to the second power supply potential Vss, and its other conduction terminal (drain) connected to the cathode of diode 75. Diode 75 has its anode connected to the one conduction terminal of MOS transistor 73 and the base of npn bipolar transistor 77. Diode 75 is provided for setting the low potential of the output signal potential Vout appearing on output signal line 12 to be Vbe (=Vf). Resistor 18 is provided between the output node (the common connection node of diodes: 13 and 14) of semiconductor logic circuit 10 constituting the input stage, in order to charge/discharge output signal line 12 at a high speed. Resistor 18 does not necessarily have to be provided.

The operation of semiconductor logic circuit 10 constituting the input stage is identical to that described in conjunction with FIGS. 1 and 3, and, therefore description will not be provided thereon. When the output signal potential Vout is at its high level, output signal line 12 is charged through bipolar transistor 16. In this case, as is the case with FIG. 3, the output potential Vout at its highest level is Vdd−Vbe. The case in which the output signal potential Vout is pulled down to its low level will be described.

When the input signal potential Vin is a high potential, n channel MOS transistor 73 conducts. Base current is supplied from MOS transistor 73 to the base of npn bipolar transistor 77 through output signal line 12 and resistor 18. Diode 75 is provided for supplying the base-emitter voltage of npn bipolar transistor 77. N channel MOS transistor 79 is provided for pulling down the output signal potential Vout at a higher speed by rendering the base-emitter voltage of bipolar transistor 77 larger than the forward voltage Vf applied by diode 75 by the on-resistance and bringing npn bipolar transistor 77 into a deeper on-state, when the output signal potential Vout is a high potential.

The gate potential of n channel MOS transistor 79 is provided by the output signal of semiconductor logic circuit 10 at its input, in other words, by the output signal (drain potential) of p channel MOS transistor 1. Also in this case, the gate potential of n channel MOS transistor 79 is 2·Vf at its lowest reaching potential, and n channel MOS transistor 79 supplies current to diode 75 in its steady state.

Therefore in the case of this structure, the lowest potential of the output signal potential Vout is determined by the anode potential of diode 75 to be Vf. At that time, current constantly flows to diode 75, and the lowest potential of the output signal potential Vout can stably and surely be determined to be Vf. Bipolar transistor 77 has its base potential set to be Vf (=Vbe), and supplies a very small current in its steady state.

The provision of n channel MOS transistor 79 permits a larger base current to be supplied to npn bipolar transistor 77, enabling discharging of output signal line 12 through bipolar transistor 77 at a high speed.

Figure 5:
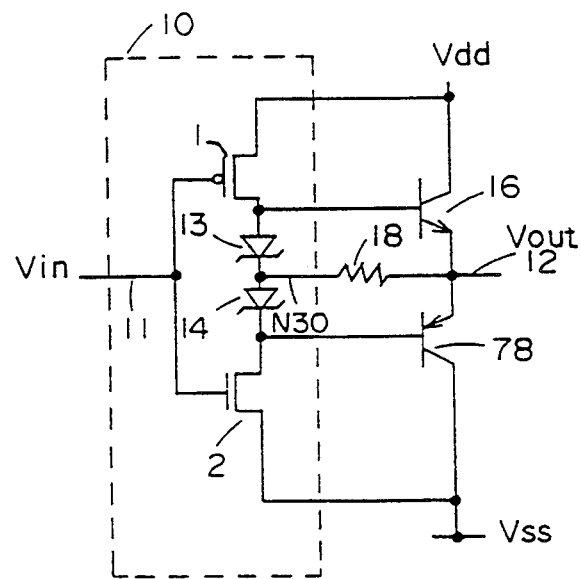
FIG. 5 is a diagram showing a structure of a semiconductor logic circuit in accordance with yet another embodiment of the present invention.

FIG. 5 is a diagram showing a structure of a semiconductor logic circuit in accordance with a further embodiment of the present invention. The semiconductor logic circuit shown in FIG. 5 provides a CBiCMOS inverter gate circuit. The circuit structure itself is disclosed by Fujishima et al. in Technical Digest of Symposium on VLSI Circuits, 1990 Symposium on VLSI Circuits Association, pp. 91-92.

Referring to FIG. 5, the semiconductor logic circuit includes at its input stage a CMOS inverter gate circuit 10 having a similar structure to the semiconductor logic circuit shown in FIG. 1. The semiconductor logic circuit shown in FIG. 5 further includes at its output stage, an npn bipolar transistor 16 for charging output signal line 12 in response to the output signal of semiconductor logic circuit 10, and a pnp bipolar transistor 78 for discharging output signal line 12 in response to the output signal of the semiconductor logic circuit at the input stage. Npn bipolar transistor 16 has its collector connected to the first power supply potential Vdd, its base connected to the drain of p channel MOS transistor 1, and its emitter connected to output signal line 10. Pnp bipolar transistor 77 has its emitter connected to output signal line 12, its base connected to the drain of n channel MOS transistor 2, and its collector connected to the second power supply potential Vss.

Provided between the node N30 of semiconductor logic circuit 10 of the input stage and output signal line 12 is a resistor 18 for performing charge/discharge of output signal line 12 at a high speed. If node N30 is isolated from output signal line 12 exclusive of resistor 18, a desired operation can be provided. Node N30 may be coupled to output line 12 directly without resistor 18.

In the structure shown in FIG. 5, Fujishima et al. presents that when a power supply is shared by a CMOS transistor and a bipolar transistor, the bipolar transistor is deactivated at the time of full swing operation an output node (output signal line 12) is charged from Vdd−Vbe to Vdd or discharged from Vbe to 0 V (Vss), and that in the case of the structure of a low power supply voltage driving, a separate power supply should be provided each for the CMOS portion and the bipolar portion.

When the input signal is fully swung (when its logic amplitude is equal to power supply voltage: where Vss=0 V), shifting by the base-emitter voltage of bipolar transistors 16 and 77 is caused (the clamping operation of diodes 13 and 14 also functions), the logic amplitude of the output signal potential Vout of output signal line 12 falls in the range between Vdd−Vbe and Vbe. The structure is therefore not consistent with a full swing CMOS logic circuit provided at the next stage, and their use has not been much active.

However, in combination with the circuit structures shown in FIGS. 1, 3 and 4, the circuit structure shown in FIG. 5 can effectively be utilized. More specifically, in the circuit structure shown in FIG. 5, the logic amplitude of the input signal potential Vin in use is made smaller than the power supply voltage Vdd. P channel MOS transistor 1, diodes 13 and 14 and n channel MOS transistor 2 can constantly be supplied with a very small current. The structure is different from conventional structures in that a very small current constantly flows through diodes 13 and 14. This constant application of very small current permits the voltage shift function of diodes 13 and 14 to be fully effective, so that the logic amplitude of the output signal potential Vout appearing on output signal line 12 can stably be set as Vdd−2·Vf.

In the above-described circuit structures shown in FIGS. 1, 3 to 5, each circuit is described converting a signal of ECL level into a signal of CMOS level or receiving a level-limited signal through a level limiting circuit 100 by way of illustration, but these circuits can be applied to any circuit portion which receives a signal of partial swing (a signal whose logic amplitude is smaller than a power supply voltage, i.e. Vdd−Vbe to Vbe).

As described above, the circuit structures shown in FIGS. 1, 3 to 5 have a common structure of CMOS circuit provided at each of their input stages, and, therefore, the logic amplitudes of the outputs of the logic circuits can all stably and surely be equalized.

In the foregoing, diodes 13, 14, 15 and 75 are PN diodes by way of illustration. But schottky diodes may be used for these diodes (see drawing within the solid circle of FIGS. 1, 3, 4 and 5). A schottky diode has a smaller forward voltage Vf than a PN diode, thus reducing constant current flowing through inverter circuits. This is because voltage applied across the gate-source region of MOS transistors 1 and 2 of semiconductor logic circuit at its input portion is further reduced.

Another approach for reducing constant current flowing through the inverter gate circuit of a semiconductor logic circuit at its input stage is to enlarge the threshold voltage $|Vgs|$ of the MOS transistor. As stated above, the smaller the voltage $|Vgs|$ applied across the gate/source region of the MOS transistor is than the threshold voltage $|Vth|$ of the MOS transistor, the smaller will be its drain current. Selecting the relation between the threshold voltage Vth of the MOS transistor and the forward voltage Vf of the diode to be |Vth| > Vf, the drain current which flows in the steady state can be subthreshold current. The subthreshold current is drain current which changes exponentially with respect to the gate-source voltage Vgs. The subthreshold current flows through the weakly inverted region of the MOS transistor.

In the above-described embodiment, the inverter gate circuit is illustrated. However, the semiconductor logic circuit of the present invention is not limited to the inverter gate circuit, but is also applicable to multi-input logic circuit such as 2-input logic circuit, 3-input logic circuit, etc.

Figure 6:
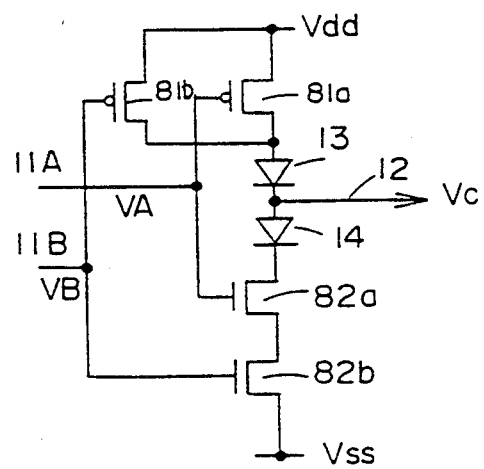
FIG. 6 is a diagram showing a structure of a semiconductor logic circuit in accordance with a still further embodiment of the present invention.

FIG. 6 is a diagram showing a structure of a semiconductor logic circuit in accordance with yet another embodiment of the present invention. The circuit shown in FIG. 6 is a CMOS 2-input NAND gate circuit. In FIG. 6, p channel MOS transistors 81a and 81b are connected in parallel between diode 13 and a first power supply potential Vdd, and n channel MOS transistors 82a and 82b are connected in series between diode 14 and a second power supply potential Vss. The gates of MOS transistors 81a and 82a are connected to an input signal line 11A, and the gates of MOS transistors 81b and 82b are connected to an input signal line 11B. A brief description will be provided on the operation.

When at least one of input signals VA and VB is at a low potential level, at least one of p channel MOS transistors 81a and 81b is conducting. The output signal Vc of output signal line 12 is charged to a high potential. Also in this case, if the logic amplitudes of the input signals VA and VB are set in the range between Vdd−Vf and Vf, the high potential of the output signal Vc is Vdd−Vf.

With the input signals VA and VB both being at a high potential level, MOS transistors 82a and 82b are both conducting, thus decreasing the potential of output signal line 12. At that time, as is the case with the foregoing, current constantly flows through diodes 13 and 14, and, therefore the output signal Vc of output signal line 12 is Vf at its low potential level.

Figure 7:
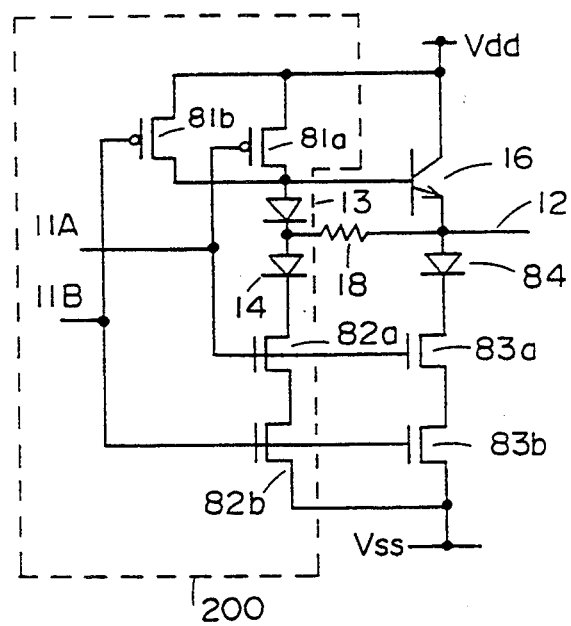
FIG. 7 is a diagram showing a structure of a semiconductor logic circuit in accordance with a still further embodiment of the present invention.

FIG. 7 is a diagram showing a structure of a semiconductor logic circuit in accordance with a still further embodiment of the present invention. The semiconductor logic circuit shown in FIG. 7 provides a BiNMOS 2-input NAND gate circuit. The semiconductor logic circuit shown in FIG. 7 includes at its input stage a semiconductor logic circuit 200 shown in FIG. 6. The semiconductor logic circuit further includes as an output stage an npn bipolar transistor 16 responsive to the output signal of input stage 200 for charging output signal line 12 to a high potential level, a diode 84 for shifting the low potential of output signal line 12 by the amount of its forward voltage, and n channel MOS transistors 83a and 83b connected in series between diode 84 and the second power supply potential Vss.

The gates of n channel MOS transistors 83a and 83b are connected to input signal lines 11A and 11B, respectively. Provided between the output node (the connection node of diodes 13 and 14) of input stage 200 and output signal line 12 is a resistor 18. The operation of the circuit shown in FIG. 7 is essentially identical to that of the BiNOS inverter gate circuit shows in FIG. 3, and output signal line 12 is charged to the level of Vdd−Vf when at least one of p channel MOS transistors 81a and 81b is conducting.

With n channel MOS transistors 83a and 83b both conducting, the potential of output signal line 12 is clamped to Vf by diode 84.

In this circuit structure, similar operation properties are achieved if it is not for diode 14, n channel MOS transistors 82a and 82b, or resistor 18.

Figure 8:
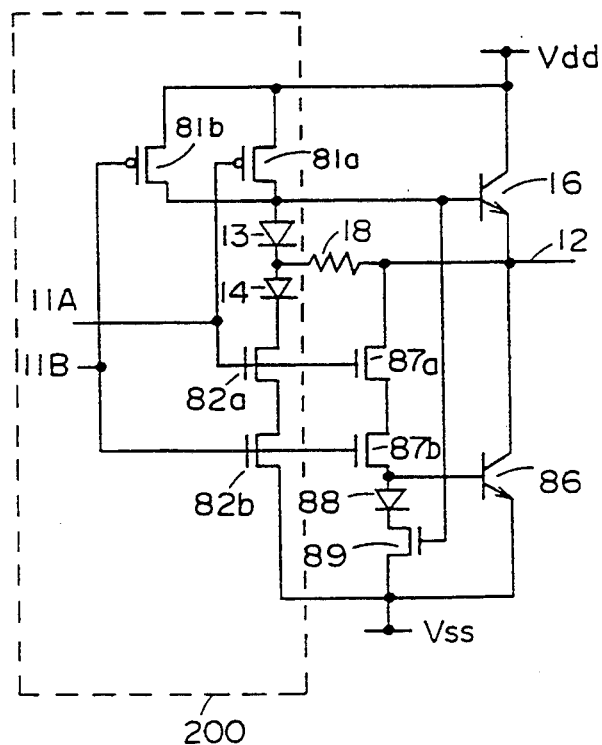
FIG. 8 is a diagram showing a structure of a semiconductor logic circuit in accordance with a still further embodiment of the present invention.

FIG. 8 is a diagram showing a structure of a semiconductor logic circuit in accordance with a still further embodiment of the present invention. The semiconductor logic circuit shown in FIG. 8 provides a BiCMOS 2-input NAND gate circuit. Referring to FIG. 8, the semiconductor logic circuit includes at its input stage 200 the CMOS 2-input NAND gate shown in FIG. 6. The semiconductor logic circuit further includes an npn bipolar transistor 16 for charging output signal line 12 to a high potential level, an npn bipolar transistor 86 for discharging output signal line 12 to a low potential, n channel MOS transistors 87a and 87b for controlling conduction of npn bipolar transistor 86 in response to a signal potential on input signal lines 11A and 11B, a diode 88 for supplying the base-emitter voltage of npn bipolar transistor 86, and an n channel MOS transistor 89 for operating bipolar transistor 86 at a high speed. The structure of the output stage is substantially identical to the inverter gate circuit shown in FIG. 4 with the only difference being that n channel MOS transistors 87a and 87b are provided in series between output signal line 12 and diode 88. Therefore, the operation will not be described. Also in the structure shown in FIG. 8, the output signal potential on output signal line 12 is Vdd−Vf at its high level, and Vf at its low level, and an output signal obtained has a logic amplitude the same as an input signal applied to input signal lines 11A and 11B.

Figure 9:
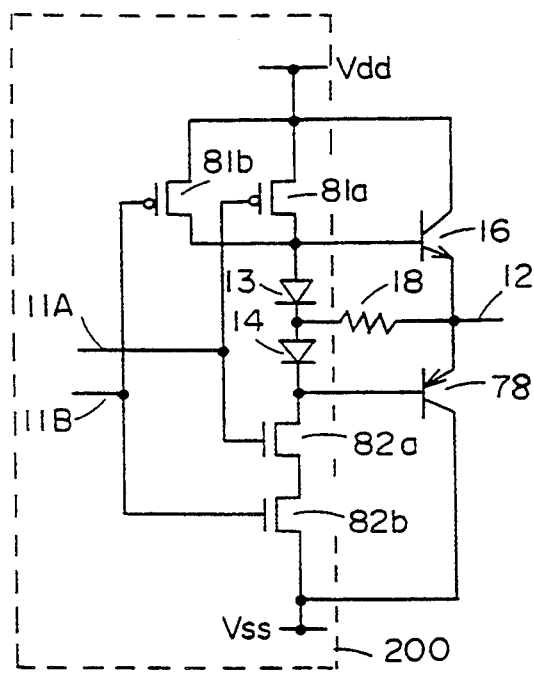
FIG. 9 is a diagram showing a structure of a semiconductor logic circuit in accordance with a still further embodiment of the present invention.

FIG. 9 is a diagram showing a structure of a semiconductor logic circuit in accordance with a still further embodiment of the present invention. The semiconductor logic circuit shown in FIG. 9 provides a CBiCMOS 2-input NAND gate circuit. The input stage 200 of the semiconductor logic circuit shown in FIG. 9 has the same structure as the CMOS 2-input NAND gate circuit shown in FIG. 6. Provided at the output stage are an npn bipolar transistor 16 for charging output signal line 12, and a pnp bipolar transistor 78 for discharging output signal line 12. The operation of the input stage 200 of the circuit shown in FIG. 9 is the same as that shown in FIG. 6, the operation of the output stage is the same that of the CBiCMOS inverter gate circuit shown in FIG. 5 and description will not be repeated thereon. Resistor 18 may be omitted.

Figure 10:
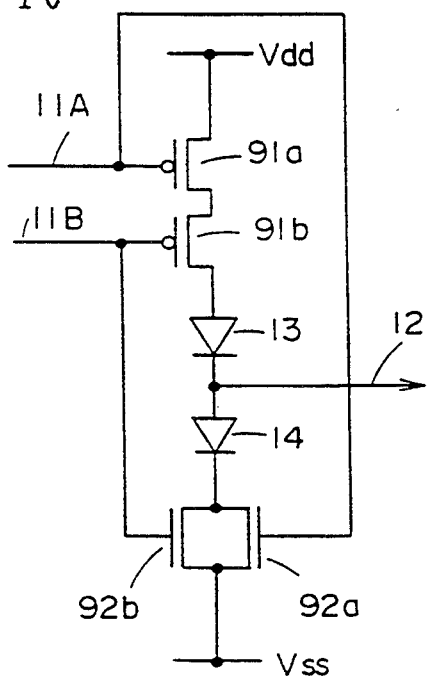
FIG. 10 is a diagram showing a structure of a semiconductor logic circuit in accordance with a still further embodiment of the present invention.

The semiconductor logic circuit in accordance with the present invention can further be applied to a 2-input NOR gate circuit. FIG. 10 is a diagram showing a structure of a semiconductor logic circuit in accordance with a still further embodiment of the present invention. The semiconductor logic circuit shown in FIG. 10 provides a CMOS 2-input NOR gate. Referring to FIG. 10, the semiconductor logic circuit includes p channel MOS transistors 91a and 91b connected in series between the first power supply potential Vdd and diode 13, and n channel MOS transistors 92a and 92b connected in parallel between diode 14 and the second power supply potential Vss. The gates of MOS transistors 91a and 92a are connected to input signal line 11A. The gates of MOS transistors 91b and 92b are connected to input signal line 11B. The logic amplitudes of input signals applied to input signal lines 11A and 11B are both reduced to Vdd−2 Vf. The operation will briefly be described.

When at least one of the input signals applied to input signal lines 11A and 11B is at a high potential level, at least one of n channel MOS transistors 92a and 92b conducts. Thus, the output potential of output signal line 12 is discharged, and the output signal potential of output signal line 12 becomes a low potential of Vf.

When the potentials of input signals applied to input signal lines 11A and 11B are both at a low potential level, p channel MOS transistors 91a and 91b conduct. Thus, the output signal potential of output signal line 12 is raised to Vdd−Vf.

The various structures of the BiNMOS 2-input NOR gate circuit, BiCMOS 2-input NOR gate and CBiCMOS 2-input NOR gate circuit can be provided by combining the structures of the outputs of the circuits shown in FIGS. 7-9 with the OR gate circuit shown in FIG. 10 as an input stage.

As described above, the structure of the CMOS gate circuit at the input stage can be used in common by semiconductor logic circuits, and a desired semiconductor logic circuit can readily be designed in a cell based designing using the structure of the gate circuit at the input stage as a basic cell.

Previously it is described that a conventional amplitude limiter may be employed for the amplitude limiting circuit 100 with some penalty to the operating performance. Now, an improved amplitude limiting circuit will be discussed.

Figure 11:
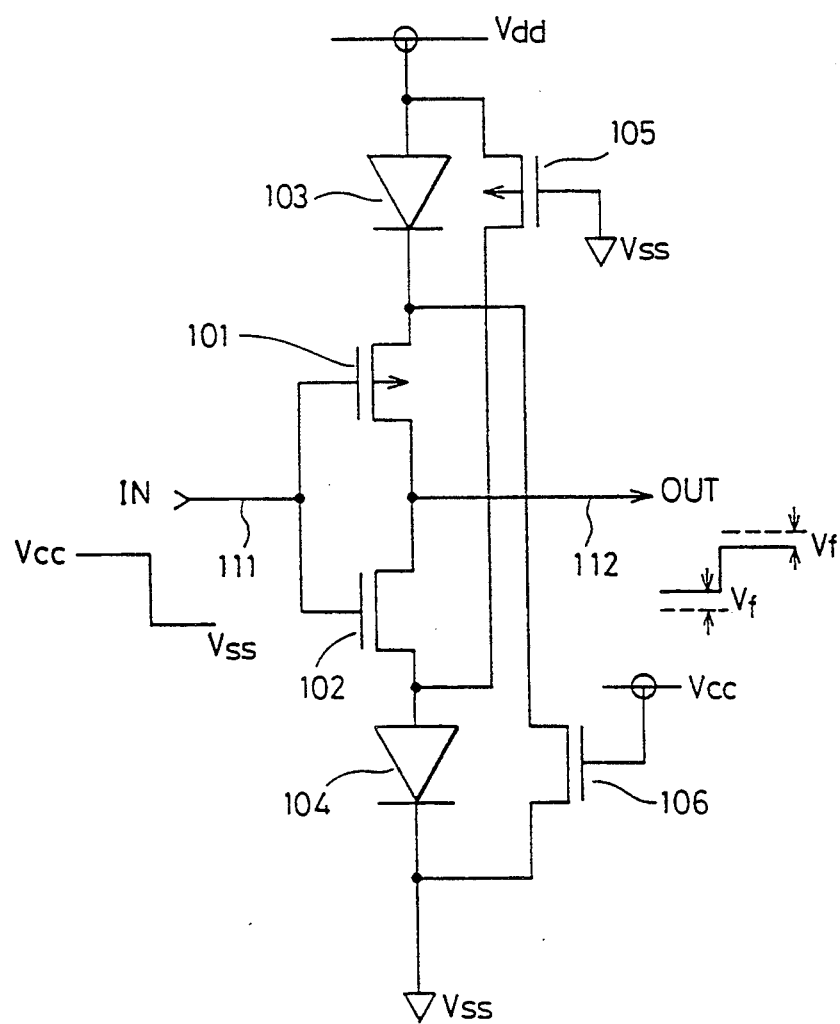
FIG. 11 shows a construction of an amplitude limiting circuit formed according to the present invention.

Referring to FIG. 11, an amplitude limiting circuit 100 includes complementarily connected p channel MOS transistor 101 and n channel MOS transistor 102 whose gates are connected to a signal input line 111, a diode 103 connected between the power supply potential Vdd and the MOS transistor 101 in a forward direction, and a diode 104 connected between the MOS transistor 102 and the ground potential Vss. MOS transistors 101 and 102 have their drains connected in common to a signal output line 112.

The amplitude limiting circuit 100 further includes a p channel MOS transistor 105 having a gate connected to the ground potential Vss to provide a current flow to diode 104, and an n channel MOS transistor 104 having a gate connected to the power supply voltage Vcc to extract a current flow from the diode 103. MOS transistors 105 and 106 serve as a resistor. Now, an operation of the circuit 100 will be described.

When a signal IN on the line 111 rises from a low level at Vss level to a high level at Vcc level, the transistor 101 is turned off, and the transistor 102 is turned on. The signal line 112 is discharged through the transistor 102 and the diode 104. The diode 104 clamps the potential of a signal OUT on the line 112 at Vf, where Vf is a forward voltage drop of the diode 104. Even if the signal OUT has the potential of Vf, the diode 104 receives a current flow (small current flow because of a large on-resistance of the transistor 105), so that the diode 104 precisely clamps the potential of the signal OUT at Vf.

When the signal IN falls from the high level of Vcc level to the low level of Vss level, the transistor 101 is turned on, and the transistor 102 is turned off. The signal line 112 is charged through the transistor 101 and the diode 103 from the power supply, so that the signal OUT has the high level of (Vcc−Vf) level, where Vf is also a forward voltage drop of the diode 103. In this situation, the diode 103 has a current flow extracted by the transistor 106 having a large on-resistance, so that the diode 103 reliably clamps the potential of the signal OUT at (Vcc−Vf) level.

Figure 23:
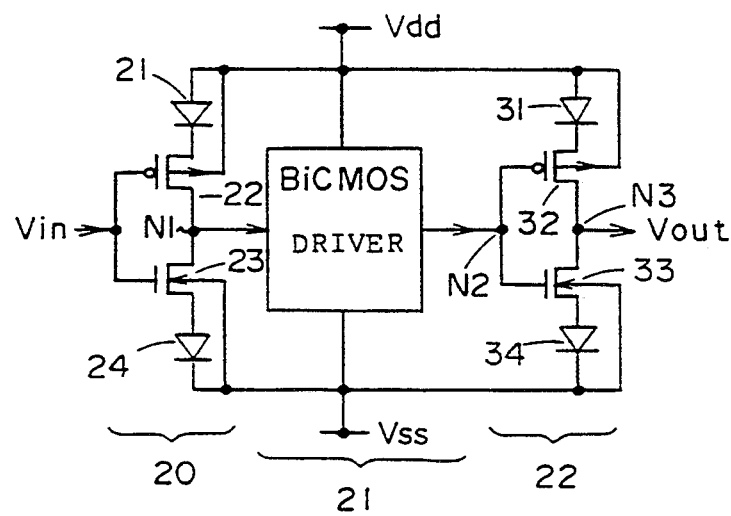
FIG. 23 is a diagram showing a structure of a conventional semiconductor logic circuit which reduces its logic amplitude.

In the configuration of FIG. 11, the diodes 103 and 104 are connected in series to the transistors 101 and 102, respectively, different from that of FIG. 23, and no junction capacitance problem occurs to insure a high speed operation.

In the embodiments, a diode is employed to limit a logical swing of an output by its clamping function. It is preferable to make a forward voltage drop Vf of the diode equal to a base-emitter voltage of a bipolar transistor in a BiNMOS circuit, a BiCMOS circuit and a CBiCMOS circuit. Thus, a diode is formed of a bipolar transistor for such circuits.

Figure 12A:
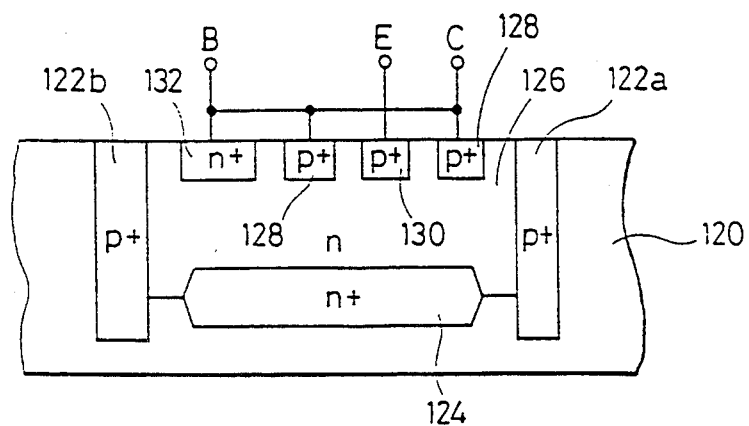
FIGS. 12A and 12B show the structure of a diode used in the present invention.

FIG. 12A shows a schematic cross sectional view of a diode formed of a bipolar transistor. Referring to FIG. 12A, the bipolar transistor is formed on a semiconductor substrate 120 surrounded by a p+ trench isolation regions 122a and 122b for isolating the transistor from other elements. The bipolar transistor includes a n+ buried base layer 124 for reducing a base resistance, an n type layer 126 as a base region B formed on the buried region 124, an n+ base electrode layer 132 formed on the surface of the n type layer 126, a p+ layer 128 formed on the surface of the n type layer 126 serving as a collector region C, and p+ layer 130 formed on the surface of the n type layer 126 surrounded by the layer 128 and serving as an emitter E. The shown transistor provides a lateral pnp transistor in which the collector region 128 and the emitter region 130 are formed simultaneously.

Figure 12B:
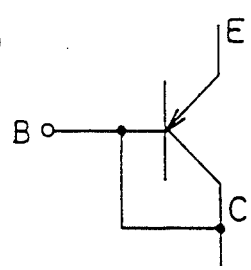

When the layer 128 and the layer 132 are short-circuited, the resultant structure provides a PN diode as shown in FIG. 12B. A pnp transistor is employed in a CBiCMOS circuit, so that the diode shown in FIG. 12B can be employed for CBiCMOS circuit. Of course, another structure of pnp transistor instead of the lateral pnp transistor may be employed.

Figure 13A:
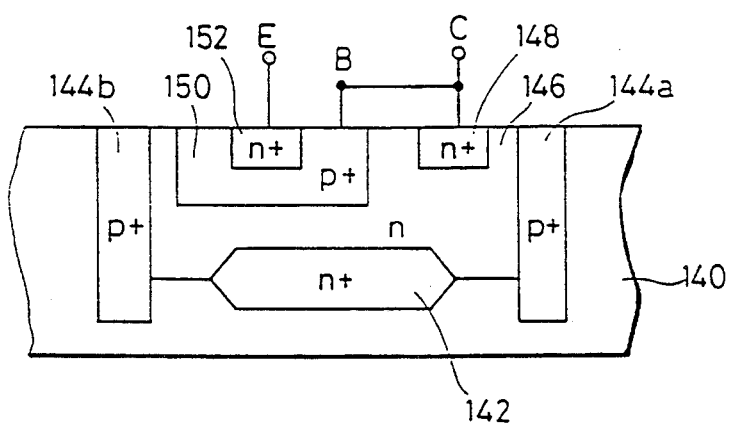
FIGS. 13A and 13B show the another structure of a diode used in the invention.

FIG. 13A shows a schematic cross sectional view of npn bipolar transistor of a vertical type. Referring to FIG. 13A, the bipolar transistor is formed on a semiconductor substrate 140, and includes an n+ collector buried layer 142 for reducing a collector resistance, an n type layer 146 serving as a collector, an n+ layer 148 formed on the surface of the n type layer 146 and serving as a collector electrode layer C, a p+ well layer 150 formed on the surface of the n type layer 146 and serving as a base B, and n+ layer 152 formed on the surface of the p+ well region 150 and serving as an emitter E. Strictly stating, the p+ well region 150 includes a p region as an active base region, and a p+ region as a base electrode layer. However, in the shown structure, the base of the transistor is shown to include only p+ well region for simplicity of the drawing.

Figure 13B:
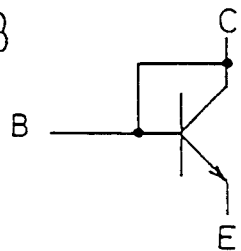

When the n+ layer 148 is short-circuited to the p+ well region 150, the npn bipolar transistor has its collector and its base short-circuited to provide a PN diode as shown in FIG. 13B. NPN bipolar transistor is employed in a BiNMOS circuit, a BiCMOS circuit and CBiCMOS circuit. Thus, the PN diode as shown in FIGS. 13A and 13B can be employed in any circuit other than a CMOS circuit.

As shown in FIGS. 12A through 13B, a bipolar transistor has a collector and a base interconnected is used as a diode, and a forward voltage drop Vf can be made identical to a base-emitter bias voltage of a bipolar transistor. Thus, over the entire logic swing region, a fast operability of a circuit is insured.

Heretofore, various transistor circuit configurations are discussed. In general, each circuit has a fast operability dependent on an output load.

Figure 14:
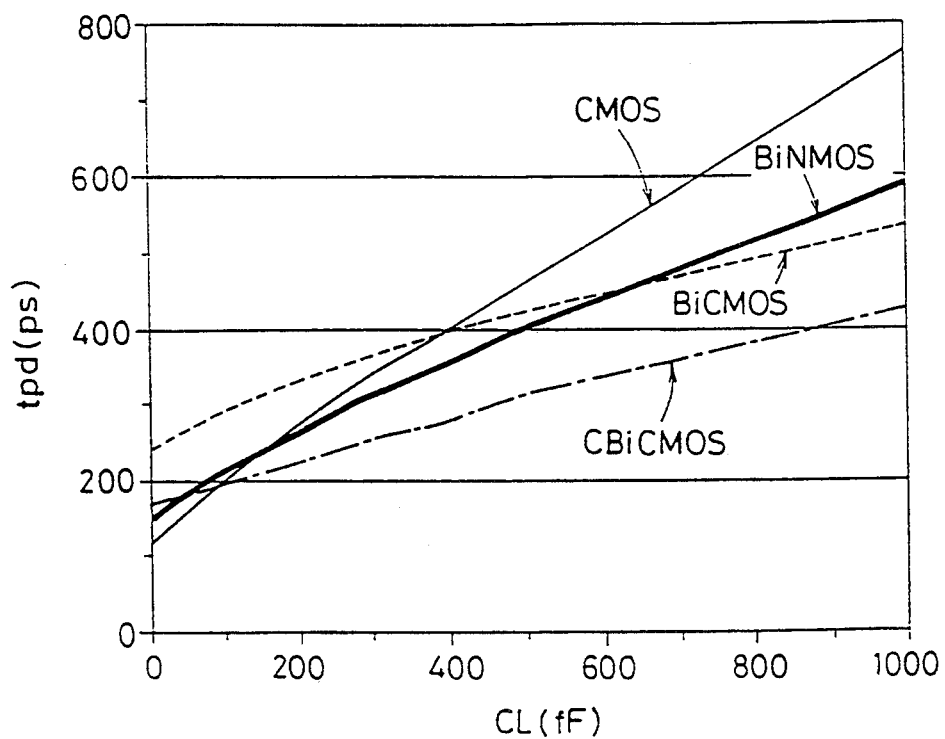
FIG. 14 shows relationship between a gate delay time and an output load.

FIG. 14 shows a relationship between a gate delay time and an output load obtained by a simulation for 2 input AND gate, for each circuit structure. In FIG. 14, the horizontal axis represents an output load in a unit of fF (femto Farad), and the vertical axis represents a gate delay time in a unit of pico second.

As is clearly seen from FIG. 14, the gate delay time tpd increases as the output load CL increases. CMOS circuit provides the smallest gate delay time where the output load CL is less than 100 fF. In a case that the output load CL is greater than 400 fF, the CMOS circuit provides the greatest gate delay time. CBiCMOS circuit demonstrates the smallest gate delay time where the output load CL is greater than 100 fF.

Therefore, an appropriate circuit construction should be selected depending on an output load to be driven, in order to implement a high speed operating device. Now, specific application of the present invention will be described.

Figure 15:
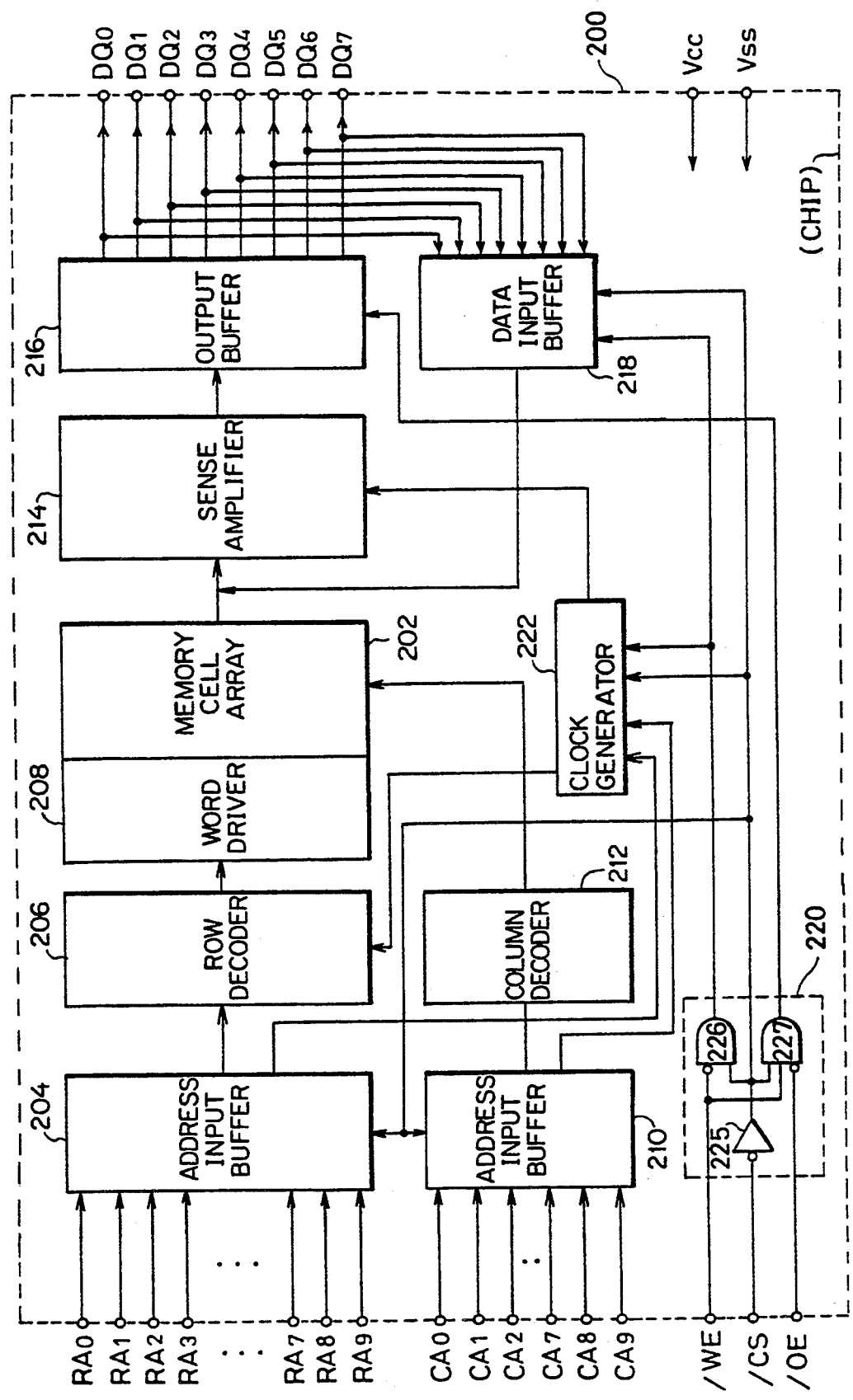
FIG. 15 shows an entire arrangement of a static RAM.

FIG. 15 shows schematically an entire arrangement of a static random access memory Referring to FIG. 1%, the static random access memory (SRAM) 200 includes a memory cell array 202 having a plurality of static type memory cells arranged in a matrix of rows and columns, a row address buffer 204 for receiving applied row address bits RA0 to RA9 to generate an internal row address signal, a row decoder 206 for decoding the internal row address signal to generate a row selection signal, and a word driver 208 responsive to the row selection signal to drive a corresponding row or word line in the memory cell array 202 into a selected state.

SRAM 200 further includes a column address buffer 210 for receiving applied column address bits CA0 to CA9 to generate an internal column address signal, a column decoder 212 for decoding the internal column address signal to generate a column selection signal for selecting a column or a pair of bit lines in the memory cell array 202. In FIG. 15, the memory cell array 202 includes column select gates provided for respective columns of the array 202 and responsive to the column selection signal in practice. However, the column select gates are not shown in FIG. 15 for simplicity of the drawing.

SRAM 200 further includes a sense amplifier 214 for amplifying a data of a selected memory cell designated by row and column decoders 206 and 212 in a data reading operation, an output buffer 216 for amplifying and shaping the waveform of the output of the sense amplifier 214 to generate read-out data, and a data input buffer including a write buffer for receiving a write-in data and generating and transmitting an internal write-in data to the selected memory cell. In FIG. 15, the read-out data and the write-in data are transmitted through common pin terminals, and therefore the read-out data and the write-in data are represented in common by symbols DQ0 to DQ7, wherein 8 bits are read out or written in at a time.

SRAM 200 further includes a controller 220 responsive to a write enable signal /WE, a chip select signal /CS and an output enable signal /OE for generating internal control signals, and a clock generator 222 responsive to the internal clock signals and the internal row and column address signals for generating internal clock signals.

The controller 220 includes an inverter 225 receiving and inverting in logic the chip select signal /CS, a gate circuit 226 receiving the write enable signal /WE at a false input and an output of the inverter 225 at a true input, and a gate circuit 227 receiving the output enable signal /OE at a false input and the write enable signal /WE and the output of the inverter 225 at true inputs. The outputs of inverter 225 and the gate circuit 226 are supplied to data input buffer 218 for controlling the activation of the buffer 218. The output of the gate circuit 227 is supplied to the output buffer 216.

Data input buffer 218 is activated in response to the chip select signal /CS and transfers the internal write-in data in response to the write enable signal /WE. Output buffer 216 is activated to generate read out data in response to the output enable signal /OE.

Clock generator 222 detects an address transition timing to generate an address transition signal ATD in response to the internal address signals, to activate the row decoder 206. Clock generator 222 also controls the activation of the sense amplifier 214 in response to the outputs of the inverter 225 and the gate circuit 226, or the write enable signal /WE and the chip select signal /CS.

SRAM 200 is an internal synchronized type memory in which internal operation timings are determined by the address transition signal ATD, and the operation of such SRAM is known in the art.

In recent trend, SRAM is required to operate as fast as possible even if the storage capacity is increased. According to the present invention, CMOS circuitry is employed for driving a relatively small output load while BiNMOS circuitry, BiCMOS circuity and CBiCMOS circuitry are employed for driving a large output load, in order to provide fast operability.

Figure 16:
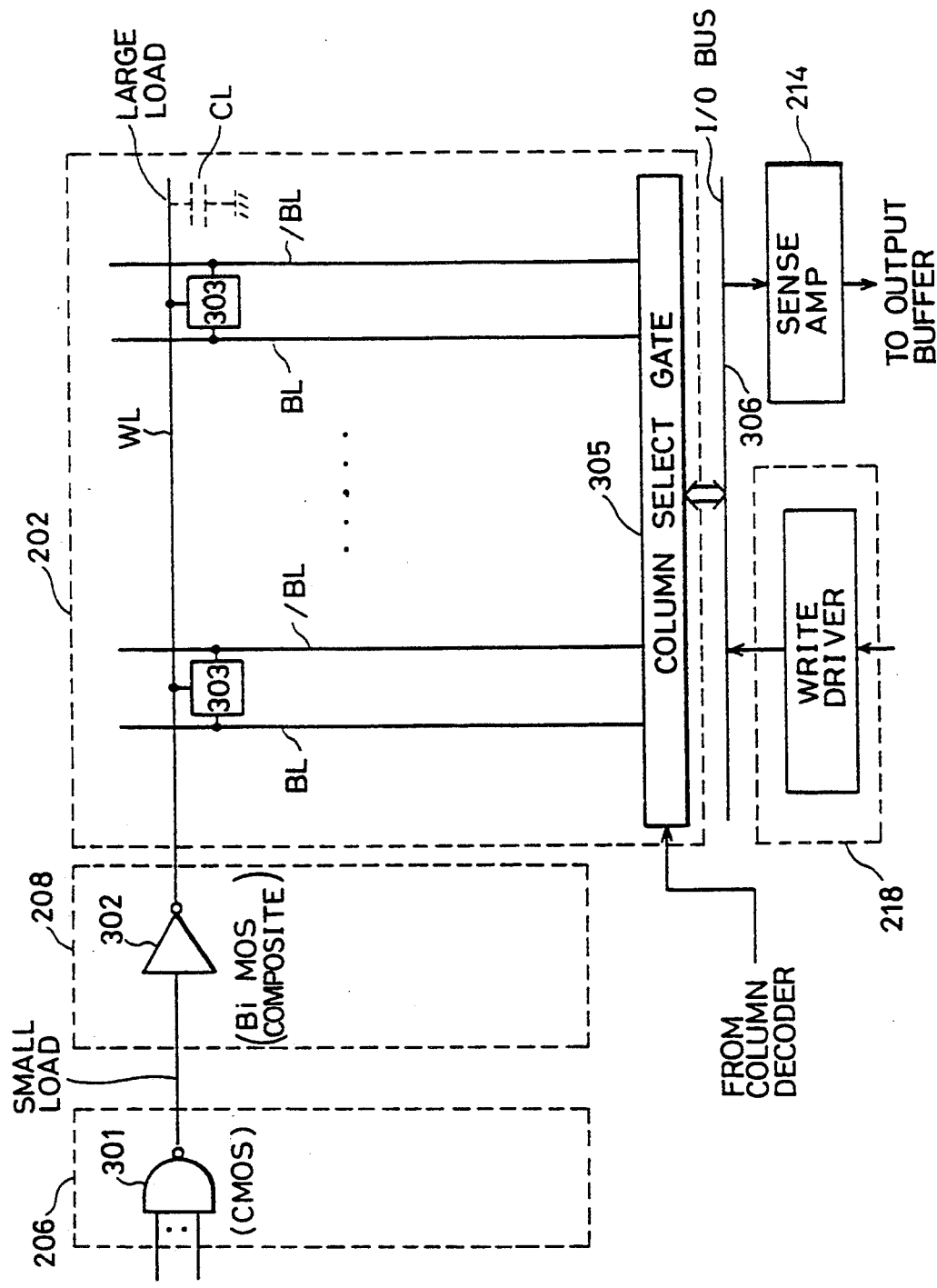
FIG. 16 shows a main portion of SRAM of the present invention.

FIG. 16 shows a main portion of SRAM according to the present invention. Referring to FIG. 16, the memory cell array 202 is shown including a word line WL having a static type memory cells 303, . . . 303 of a row connected, and two pairs of bit lines BL, /BL each connecting memory cells of one column. The memory cell array 202 also includes a column select gate 305 responsive to a column selection signal from the column decoder to connect a corresponding column to an I/O bus 306.

Row decoder 206 includes a NAND type decode circuit 301 provided for each word line. The NAND type decode circuit 301 receives a combination of predetermined internal address signal bits and generates a low level signal when selected.

Word driver 208 includes a drive circuit 302 receiving an output of an associated NAND type decode circuit 301 to drive an associated word line to a high level. The drive circuit 302 is formed of an inverter.

The number of memory cells connected to a word line increases as the storage capacity of SRAM increases. Meanwhile, a NAND type decode circuit 301 is required to drive only an associated word line drive circuit 302 independent of the storage capacity of SRAM.

Therefore, in the present invention, the word line drive circuit 302 is formed of a composite circuit of a bipolar transistor and an MOS transistor such as BiNMOS circuit, BiCMOS circuit and CBiCMOS circuit to drive the word line having an increased or heavy load due to memory cell gate capacitances and stray capacitance at a high speed.

The word line drive circuit 302 may have any structures of FIGS. 3 to 5, and have a function of generating an amplitude limiting word line drive signal.

The decode circuit 301 is required to drive a relatively small output load due to input impedance of the drive circuit 302, and is formed of CMOS circuit. For the CMOS decode circuit, a structure shown in FIG. 10 may be utilized. An amplitude limiter may be provided in front of the row decoder, or between the row decoder and the word driver. If precise clamping of the word line potential is not required, such amplitude limiter may not be needed.

In the discussion in the above, no specific construction of memory cell is not described. The static type memory cell may include a bipolar transistor, or may include a MOS transistor.

An integrated circuit include a logic LSI (Large Scale Integrated) circuit which performs a logical processing on data. Different logic LSIs have different internal structures depending on the applications.

Figure 17:
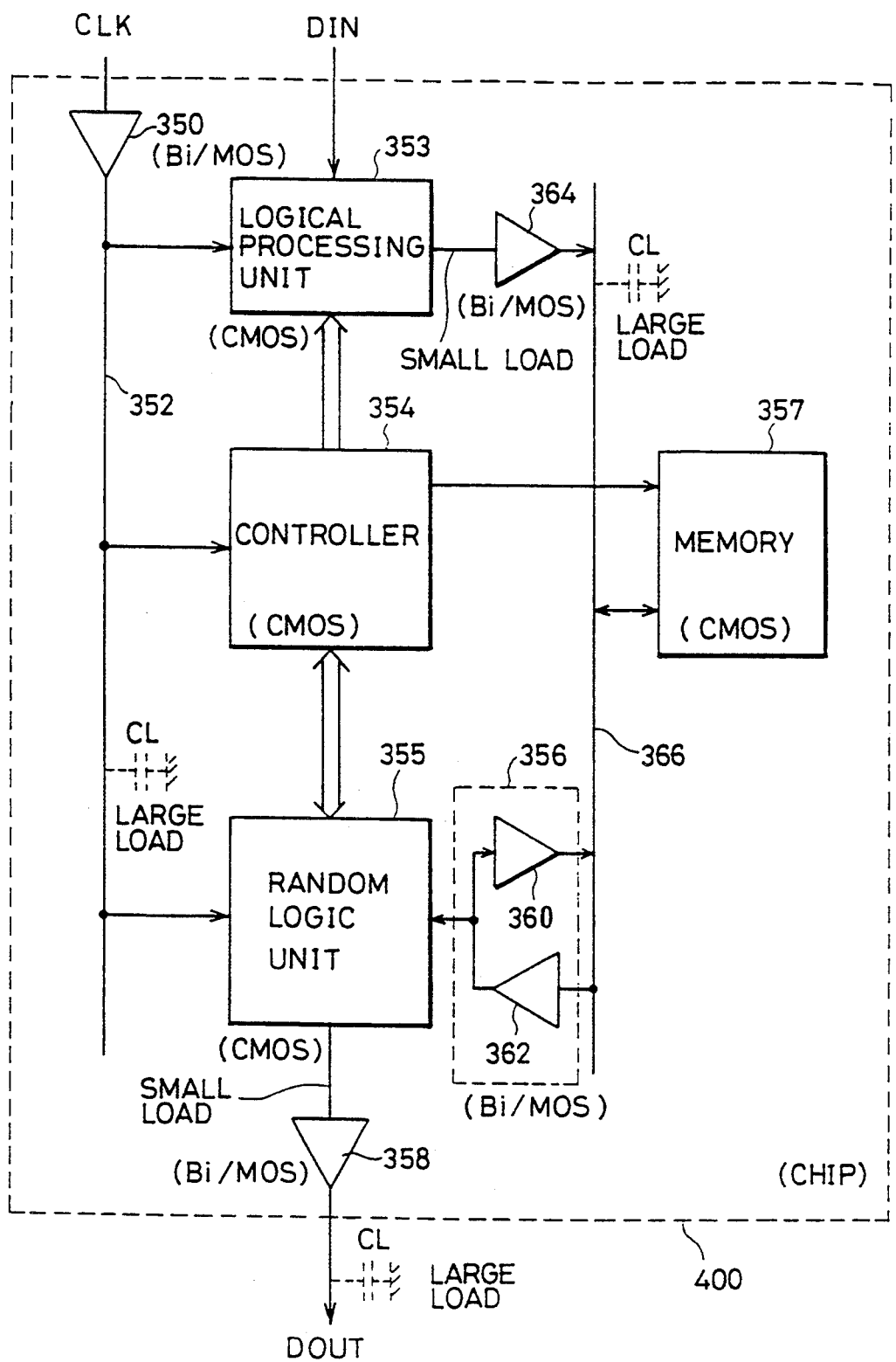
FIG. 17 shows an entire arrangement of a logic LSI of the present invention.
Figure 18:
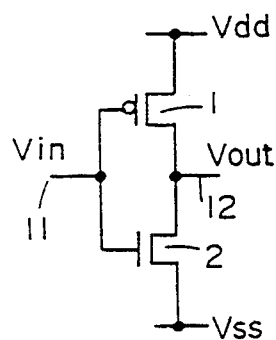
FIG. 18 is a diagram showing a structure of a conventional semiconductor logic circuit.
Figure 19:
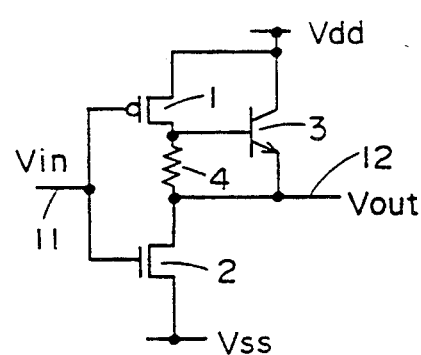
FIG. 19 is a diagram showing another structure of a conventional semiconductor logic circuit.
Figure 20:
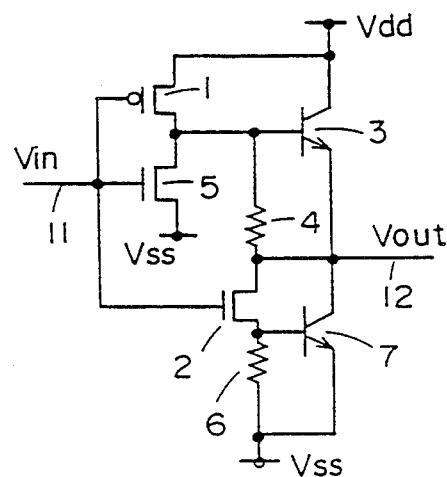
FIG. 20 is a diagram showing a further structure of a conventional semiconductor logic circuit.
Figure 21:
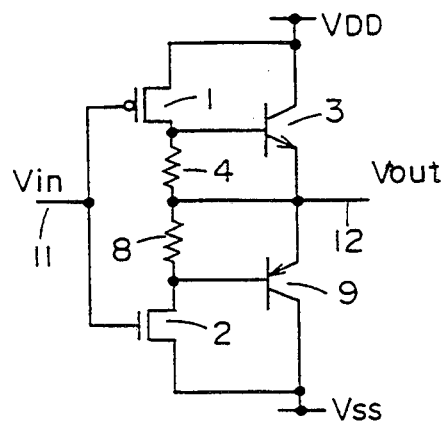
FIG. 21 is a diagram showing yet another structure of a conventional semiconductor logic circuit.
Figure 22:
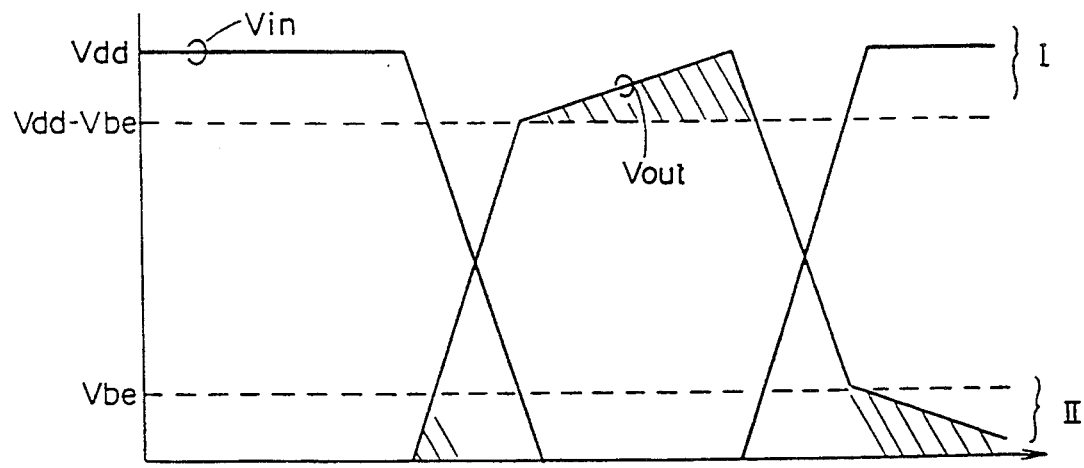
FIG. 22 is a diagram showing the logic amplitudes of input and output signals to and from a conventional semiconductor circuit.

Referring to FIG. 17, a structure of a logic LSI is schematically shown. The logic LSI 400 has a processor function, and includes a logical processing unit 353 for carrying out a logical processing on received data DIN under control of a controller 354, a random logic unit 355 for carrying out processings on data under control of the controller 354, and a memory 357 for storing data under processing. The logical processing unit 353 may include a gate array or programmable logic gates. The random logic unit 355 has a configuration optimized to reduce the number of components as small as possible.

The logical processing unit 353 performs a relatively simple processing on received data, such as delay, addition/subtraction and a multiplication. The random logic unit 355 performs a relatively complicate processing.

The controller 354 controls the operation timing of the units 353 and 354 and also determines the contents of processing to be executed by the units 353 and 354. The controller 354 also controls the read and write of data for the memory 357. The controller 354 may be a CPU core-like circuit.

The logic LSI further includes a clock buffer 350 responsive to a clock CLK for generating an internal clock onto a clock line 352 to determine operation timings of each units 353, 354 and 355, a bus driver 364 responsive to the logical processing unit 353 for driving an internal data bus 366 at a high speed, an bidirectional buffer 356 between the random logic unit 355 and the internal data bus 366, and an output buffer 358 responsive to the random logic unit 355 for generating output data DOUT.

The logic LSI is essentially CMOS circuity for reduced power dissipation and high integration. More specifically, the units 353 and 355, the controller 354 and the memory 357 are of CMOS configuration including p channel and n channel MOS transistors.

The clock buffer 350 is required to drive respective units 353, 354 and 355 at a high speed with a shaped waveform through the clock line 352. Therefore, the clock buffer 350 is of composite configuration including bipolar transistors and MOS transistors as shown in FIGS. 3, 4, 5, in order to have a large driving ability.

The internal data bus 366 has a number of unit connected thereto and therefore an increased load. Data should be transferred as fast as possible, without distortion. Therefore, the bus driver 364 and the bidirectional buffer 356 including a buffer 360 and a buffer 362 and output buffer 358 are of composite configuration including a bipolar transistor and a MOS transistor.

The logic LSI of FIG. 17 provides a processor-like function. However, a logic LSI may be of any other structures such as pipelined structure for a dedicated application. What is the most important is that a large or heavy load is driven by a composite circuit including a bipolar transistor and a MOS transistor while a small or light load is driven by a CMOS circuit including p+ and n+ transistors. As an amplitude limiter in a logic LSI, such limiter may be provided at a data input stage of the LSI or in front of the unit 353. Alternatively, respective units 353, 354 and 355 may include such limiter at the input stage. Such amplitude limiter may not be provided depending on an application, because of inherent amplitude limiting function of the circuits according to the present invention.

In the semiconductor logic circuit according to the one aspect of the present invention, the provision of two diodes between each MOS transistor and a signal output node permits the source-gate voltage of the MOS transistor to be set as $Vdd-Vf$, drain current flowing therethrough can be increased compared to the structure of a conventional circuit, charge/discharge of the signal output node (a first node) can be made at a high speed, thus providing a semiconductor logic circuit having high speed operation properties.

Also in the circuit of the input stage, the maximum value for the voltage applied across the source-drain region of the MOS transistor is $Vdd-2\cdot Vf$, a further highly integrated MOS transistor can be used with a high reliability without reducing power supply voltage itself. At that time, the maximum voltage applied across the gate-source region of the MOS transistor can be larger than the maximum voltage applied between the source/drain regions, and, therefore the drain current can be increased, thus providing a semiconductor logic circuit capable of high speed operation.

According to another aspect of the present invention, a semiconductor logic circuit including a bipolar transistor at its output stage, reduction of an output logic amplitude necessary for driving the entire region of the output logic amplitude by the bipolar transistor can stably achieved without supplying an external potential other than first and second power supply potentials.

In the present invention, the logic amplitude of an input signal and the logic amplitude of an output signal can be achieved without using an extra external power supply potential, and a large scale semiconductor logic circuit which operates stably at a high speed can be implemented by combining a plurality of such semiconductor circuits.

According to the present invention, the structure of a CMOS circuit constituting the input stage of a composite logic circuit including a bipolar transistor and a CMOS transistor is common to all of the composite logic circuits, and the logic amplitudes of the outputs of these composite logic circuits can be equalized to that of the logic circuit including only CMOS circuitry, thus providing the semiconductor logic circuit in which the matching of CMOS circuit and BiCMOS circuit can be readily made.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor logic device operable with a first operating power supply and a second operating power supply, comprising:

an amplitude limiter for limiting an amplitude of an input signal, said input signal having a first logic level at a potential level of the first operating power supply and a second logic level at a potential level of said second operating power supply, said amplitude limiter including a first limiting diode for lowering the potential level of an output signal below the potential level of said first power supply, a second limiting diode for raising the potential level of said output signal above the potential of said second power supply potential level, and current supply element for regularly causing a current flow through each of said first and second limiting diodes from said first power supply to said second power supply independent of a logic level of said input signal;

a first field effect transistor of a first type conductivity responsive to a first logic level of said output signal from said amplitude limiter for carrying current from the first operating power supply;

a first clamping means including a first diode having a first forward voltage thereacross, and conducting said current for clamping a potential of a first node to a potential of said first operating power supply minus said first forward voltage;

a second field effect transistor of a second type conductivity responsive to a second logic level of said output signal for carrying current into said second operating power supply; and a second clamping means including a second diode having a second forward voltage drop thereacross, and conducting the current carried by said second field effect transistor for clamping a potential of said first node to a potential of said second operating power supply plus said second forward voltage, said output signal from said amplitude limiter having potential levels for steadily causing a current flow both through said first and second diodes from said first operating power supply to said second operating power supply.

2. A semiconductor logic device according to claim 1, wherein said first diode is forwardly connected between said first field effect transistor and said first node, and said second diode is forwardly connected between said first node and second field effect transistor.

3. A semiconductor logic device according to claim 1, wherein said first clamping means includes a bipolar transistor having a base coupled to receive said current flow for charging an output node.

4. A semiconductor logic device according to claim 3, wherein said first diode has an anode coupled to said first field effect transistor and said base of said bipolar transistor, and a cathode coupled to said first node.

5. A semiconductor logic device according to claim 1, wherein said first and second diodes are PN junction type diodes.

6. A semiconductor logic device according to claim 1, wherein said first and second diodes are schottky type diodes.

7. A semiconductor logic device having an input stage for receiving an amplitude-limited logic signal, effecting a predetermined logical processing operation on the amplitude-limited logic signal, and supplying another logic signal indicative of a result of the logical processing operation to a first node, said input stage including:

a first field effect transistor of a first conductivity type receiving a current flow from a first operating potential supply for charging said first node to a first potential in response to said amplitude-limited logic signal, a first diode element connected between said first field effect transistor and said first node, and providing a first forward voltage drop thereacross, said first potential being equal to said first operating potential less said first forward voltage;

a second field effect transistor of a second conductivity type receiving a current flow from a second operating potential supply for discharging said first node to a second potential in response to said amplitude-limited logic signal; and a second diode element connected between said first node and second field effect transistor, and having a second forward voltage drop thereacross, said second potential being equal to said second operating potential plus said second forward voltage, wherein said amplitude-limited logic signal has a predetermined amplitude for causing a current to flow from said first operating potential supply into said second operating potential supply through said first and second field effect transistors and said first and second diode elements independent of amplitude-limited logic signal potential.

8. A semiconductor logic device according to claim 7, further comprising:

an output node;

an output stage responsive to said input stage for charging and discharging said output node with a current flow supplied from said first operating potential supply and said second operating potential supply, said output stage including a bipolar transistor in an emitter follower configuration connected between one of said first and second operating potential supplies, and said output stage driven by an output of said first field effect transistor.

9. A method of operating a semiconductor logic circuit including a first diode element for clamping a potential of an output node at a first potential in response to a first input signal and a second diode element for clamping a potential of said output node at a second potential in response to a second input signal, the method comprising the steps of:

charging said output node to said first potential while supplying a current flow through said first and second diode elements in response to the first input signal; and discharging said output node to said second potential while supplying a current flow through both said first and second diode elements in response to the second input signal, both said first and second diode elements regularly causing a current flow therethrough from a first operating power supply into a second operating power supply independent of a logic level of said first and second input signal.

10. A semiconductor logic circuit comprising:

an input terminal for receiving a binary logic signal;

first and second power supply terminals set respectively at high and low potentials;

a first field effect transistor of a first conductivity type having a gate connected to said input terminal and one of its source and drain regions connected to said first power supply terminal, said first field effect transistor responsive to a first level of said binary logic signal to conduct saturated current from said first power supply terminal and responsive to a second level of said binary logic signal to conduct a current substantially smaller than said saturated current from said first power supply terminal;

a second field effect transistor of a second conductivity type having a gate connected to said input terminal and one of its source and drain regions connected to said second power supply terminal, said second field effect transistor responsive to the second level of said binary logic signal to conduct saturated current to said second power supply terminal and responsive to the first level of said binary logic signal to conduct a current flow substantially smaller than said saturated current to said second power supply terminal;

a first diode connected between said first field effect transistor and a node for current conduction in a direction toward said node;

a second diode connected between said node and said second field effect transistor for current conduction in a direction from said node; and wherein the amplitudes of both said first and second levels are sufficient to maintain current flow through said first and second diodes.

11. A semiconductor logic circuit comprising:
a first field effect transistor responsive to a first logic level of an input signal for transferring a first current from a first power supply and responsive to a second logic level of said input signal for transferring a second current substantially smaller than said first current;

a second field transistor responsive to the second logic level of the input signal for transferring a third current to a second power supply and responsive to the first logic level of said input signal for transferring a fourth current substantially smaller than said third current to said second power supply;

a first diode for carrying current from said first field effect transistor to a node;

a second diode for carrying current from said node to said second field effect transistor; and a first bipolar transistor responsive to the current from said first field effect transistor for transferring current from the first power supply to an output node;

12. A semiconductor logic circuit according to the claim 11, wherein
said first field effect transistor is a p channel insulated gate type transistor, and said bipolar transistor is an npn bipolar transistor.

13. A semiconductor logic circuit according to claim 11, further comprising:
a third diode connected to said output node; and
a third field effect transistor responsive to said second logic level of the input signal for transferring current from said third diode to said second power supply.

14. A semiconductor logic circuit comprising:
a first field effect transistor responsive to a first logic level of an input signal for transferring current from a first power supply;

a second field transistor responsive to a second logic level of a input signal for transferring current to a second power supply;

a first diode for carrying current from said first field effect transistor to a node;

a second diode for carrying current from said node to said second field effect transistor;

a first bipolar transistor responsive to the current from said first field effect transistor for transferring current from the first power supply to said node;

a third field effect transistor responsive to the second logic level of the input signal for conducting current from said node;

a third diode for conducting current from said third field effect transistor to the second power supply; and a second bipolar transistor of the same conductivity type as that of said first bipolar transistor and responsive to current from said third field effect transistor for conducting current from said node to said second power supply.

15. A semiconductor logic circuit according to claim 14, further including:
a fourth field effect transistor responsive to a potential at a base of said first bipolar transistor for conducting current from said third diode to said second power supply, said first bipolar transistor receiving the current from said first field effect transistor at the base.

16. A semiconductor logic circuit comprising:
a first field effect transistor responsive to a first logic level of an input signal for transferring a first current from a first power supply;

a second field transistor responsive to a second logic level of the input signal for transferring a second current to a second power supply;

a first diode for carrying said first current from said first field effect transistor to a node;

a second diode for carrying said second current from said node to said second field effect transistor;

a first bipolar transistor responsive to the first current from said first field effect transistor for transferring current from the first power supply to an output node; and a second bipolar transistor having a conductivity type opposite to that of said first bipolar transistor and responsive to current conducted by said second field effect transistor for conducting current from said output node to said second power supply, wherein said input signal is amplitude-limited such that said first field effect transistor supplies a third current smaller than said first current from said first power supply in response to said second logic level of said input signal, and said second field effect transistor supplies a fourth current smaller than said second current to said second power supply in response to said first logic level of said input signal.

17. A semiconductor logic circuitry comprising:
an amplitude limiter for limiting an amplitude of an input signal such that a first potential level corresponding to a first logic level is reduced by a predetermined value and a second potential level corresponding to a second logic level is raised by a predetermined value;

a first field effect transistor responsive to a first logic level of an output signal of said amplitude limiter for transferring current from a first power supply;

a second field transistor responsive to a second logic level of the output signal for transferring current to a second power supply;

a first diode for carrying current from said first field effect transistor to a node; and a second diode for carrying current from said node to said second field effect transistor, said amplitude limiter including a third diode for reducing said first potential level, a fourth diode for raising said second potential level, and current supply means for causing a current flow through said third diode and through said fourth diode from said first power supply to said second power supply independent of the logic level of said input signal.

18. A semiconductor logic circuitry comprising:

a first field effect transistor responsive to a first logic level of an output signal of an amplitude limiter for transferring current from a first power supply;

a second field transistor responsive to a second logic level of the output signal for transferring current to a second power supply;

a first diode for carrying current from said first field effect transistor to a node; and a second diode for carrying current from said node to said second field effect transistor, wherein said amplitude limiter includes:

a third diode for conducting current from said first power supply, a third field effect transistor responsive to the first logic level of said input signal for conducting current from said third diode to an output node for generating said output signal, a fourth field effect transistor having a conductivity type opposite to that of said third field effect transistor and responsive to the first logic level of said input signal for conducting current from said output node, a fourth diode for conducting current from the fourth field effect transistor to said second power supply, first current supply means for normally conducting current from said first power supply to said fourth diode, and second current supply means for normally conducting current from said third diode to said second power supply.

19. A semiconductor logic circuitry, comprising:

an amplitude limiter for limiting an amplitude of an input signal such that a first potential level corresponding to a first logic level is reduced by a predetermined value and a second potential level corresponding to a second logic level is raised by a predetermined value;

a first field effect transistor responsive to a first logic level of an output signal of said amplitude limiter for transferring current from a first power supply;

a second field effect transistor responsive to a second logic level of the output signal for transferring current to a second power supply;

a first diode for carrying current from said first field effect transistor to a node;

a second diode for carrying current from said node to said second field effect transistor; and a first bipolar transistor responsive to the current from said first field effect transistor for transferring current from the first power supply to said node, wherein said amplitude limiter includes a third diode for reducing said first potential level, a fourth diode for raising said second potential level, and current supply means for causing current flow through said third diode and through said fourth diode from said first power supply to said second power supply independent of the logic level of said input signal.

20. A semiconductor logic circuitry, comprising:

a first field effect transistor responsive to a first logic level of an output signal of an amplitude limiter for transferring current from a first power supply;

a second field transistor responsive to a second logic level of the output signal for transferring current to a second power supply;

a first diode for carrying a current from said first field effect transistor to a node;

a second diode for carrying current from said node to said second field effect transistor;

a first bipolar transistor responsive to the current from said first field effect transistor for transferring current from the first power supply to an output node, wherein said amplitude limited includes:

a third diode for conducting a current from said first power supply, a third field effect transistor responsive to the first logic level of said input signal for conducting current from said third diode to an output node of said amplitude limiter for generating said output signal, a fourth field effect transistor having a conductivity type opposite to that of said third field effect transistor and responsive to the first logic level of said input signal for conducting current from said output node of said amplitude limiter, a fourth diode for conducting current from the fourth field effect transistor to said second power supply, first current supply means for normally conducting current from said first power supply to said fourth diode, and second current supply means for normally conducting current from said third diode to said second power supply.

21. A semiconductor logic circuit comprising:

an amplitude limiter for limiting an amplitude of an input signal such that a first potential level corresponding to a first logic level is reduced by a predetermined value and a second potential level corresponding to a second logic level is raised by a predetermined value;

a first field effect transistor responsive to the first logic level of an output signal from said amplitude limiter for transferring current from a first power supply;

a second field transistor responsive to the second logic level of the output signal from said amplitude limiter for transferring current to a second power supply;

a first diode for carrying current from said first field effect transistor to a node;

a second diode for carrying current from said node to said second field effect transistor;

a first bipolar transistor responsive to the current from said first field effect transistor for transferring current from the first power supply to an output node;

a third field effect transistor responsive to the second logic level of the output signal from said amplitude limiter for conducting current from said output node;

a third diode for conducting current from said third field effect transistor to the second power supply;

a second bipolar transistor of the same conductivity type as that of said first bipolar transistor and responsive to current from said third field effect transistor for conducting current from said output node to said second power supply; and a fourth field effect transistor responsive to a potential at a base of said first bipolar transistor for conducting current from said third diode to said second power supply, said first bipolar transistor receiving the current from said first field effect transistor at the base.

22. A semiconductor logic circuitry comprising:

an amplitude limiter for limiting an amplitude of an input signal such that a first potential level corresponding to a first logic level is reduced by a predetermined value and a second potential level corresponding to a second logic level is raised by a predetermined value;

a first field effect transistor responsive to the first logic level of an output signal of said amplitude limiter for transferring current from a first power supply;

a second field transistor responsive to the second logic level of the output signal for transferring current to a second power supply;

a first diode for carrying current from said first field effect transistor to a node;

a second diode for carrying current from said node to said second field effect transistor;

a first bipolar transistor responsive to the current from said first field effect transistor for transferring current from the first power supply to an output node; and a second bipolar transistor having a conductivity type opposite to that of said first bipolar transistor and responsive to the current conducted by said second field effect transistor for conducting current from said output node to said second power supply, wherein said amplitude limiter includes a third diode for reducing said first potential level, a fourth diode for raising said second potential level, and current supply means for causing current flow through third diode and through said fourth diode from said first power supply to said second power supply independent of the logic level of said input signal.

23. A semiconductor logic circuitry comprising:

a first field effect transistor responsive to a first logic level of an output signal of an amplitude limiter for transferring current from a first power supply;

a second field transistor responsive to a second logic level of the output signal for transferring current to a second power supply;

a first diode for carrying current from said first field effect transistor to a node;

a second diode for carrying current from said node to said second field effect transistor;

a first bipolar transistor responsive to the current from said first field effect transistor for transferring current from the first power supply to an output node; and a second bipolar transistor having a conductivity type opposite to that of said first bipolar transistor and responsive to the current conducted by said second field effect transistor for conducting current from said output node to said second power supply, wherein said amplitude limiter includes:

a third diode for conducting current for said first power supply, a third field effect transistor responsive to the first logic level of an input signal for conducting current from said third diode to an output node from said amplitude limiter, a fourth field effect transistor having a conductivity type opposite to that of said third field effect transistor and responsive to the first logic level of said input signal for conducting current from said output node from said amplitude limiter, a fourth diode for conducting current from the fourth field effect transistor to said second power supply, first current supply means for normally conducting current from said first power supply to said fourth diode, and second current supply means for normally conducting current from said third diode to said second power supply.

24. A semiconductor logic circuitry according to claim 21, wherein amplitude limiter includes;

a fourth diode for conducting current from said first power supply, a fifth field effect transistor responsive to the first logic of said input signal for conducting current from said third diode to an output node for generating said output signal, a sixth field effect transistor having a conductivity type opposite to that of said fifth field effect transistor and responsive to the first logic level of said input signal for conducting current from said output node, a sixth diode for conducting current from the sixth field effect transistor to said second power supply, first current supply means for normally conducting current from said first power supply to said sixth diode, and second current supply means for normally conducting current from said fifth diode to said second power supply.

25. A semiconductor device formed on a semiconductor chip, comprising:

CMOS circuitry including a p channel field effect transistor and an n channel field effect transistor connected in a complementary fashion, and a diode connected in series with said p channel and n channel MOS transistors for clamping a potential of an output of said CMOS circuitry, said CMOS circuitry being used for driving a small load; and composite circuitry including a bipolar transistor and a field effect transistor, and diode means for clamping an output of said composite circuitry by a forward voltage drop of said diode means, said composite circuitry being used to drive a large load, wherein said diode and said diode means each normally conducting current flowing from a first power supply to a second power supply which is lower in potential than said first power supply, independent of a logic level of a received logic signal.

26. The semiconductor logic device according to claim 1, wherein said amplitude limiter includes:

a third field effect transistor of the first type conductivity responsive to the second logic level of said input signal for generating a output signal of said first logic level and coupled to receive said first operating power supply potential through said first limiting diode element;

a fourth field effect transistor responsive to said first logic level of said input signal to generate an output signal of said second logic level and coupled to receive said second power operating supply potential through said second limiting diode element; and said current supply element including a first resistance element for supplying a current flow into said second limiting diode from said first operating power supply and a second resistance element for causing a current flow from said first limiting diode to said second operating power supply.

27. In a logic integrated circuit including a composite logic circuit for performing a logical operating, said composite logic circuit including:

a first field effect transistor responsive to a first logic level to conducting current from a first supply;

a first diode for conducting the current from said first field effect transistor to a node;

a second diode for conducting current from said node;

a second field effect transistor responsive to a second logic level of said input signal for conducting current from said second diode;

a first bipolar transistor responsive to the current from said first field effect transistor for conducting current from said first supply to an output node, said first bipolar transistor having a base connected to an anode of said first diode, and an emitter coupled to a cathode of said first diode; and a second bipolar transistor responsive to the current from said second diode for conducting current from said output node to said second power supply, said second bipolar transistor having a base connected to a cathode of said second diode, and an emitter connected to said output node.

28. Logic circuitry formed on a semiconductor chip, comprising:

CMOS circuit including n channel field effect transistor and p channel field effect transistor connected in a complementary fashion, and a first diode connected in series with said n and p channel field effect transistors for clamping potentials of first and second logic levels of an output signal in response to an input signal to said CMOS circuit, said CMOS circuit being used to drive a small load in said logic circuitry, said first diode normally conducting a current flowing from a first power supply to a second power supply independent of a logic level of said output signal; and composite circuit including a bipolar transistor at an output stage driven by complementary-connected n channel and p channel field effect transistors, and a second diode connected in series with said complementary-connected n channel and p channel field effect transistors for clamping a potential of said first and second logic levels of an output of said composite circuit, said composite circuit being used to drive a large output load, said second diode normally conducting a current flowing from said first power supply to said second power supply independent of a logic level of said output of said composite circuit.

29. Logic circuitry according to claim 28, further including a data bus for transferring data to be processed, a clock line for transferring a clock signal determining operation timing of a circuit in said logic circuitry, and an output bus for transferring data to be processed externally, and wherein said CMOS circuit receives data to be processed and carries out a processing on said data to be processed, and said composite circuit includes a clock buffer responsive to an external clock to generate said clock signal onto said clock line, a bus driver responsive to said CMOS circuit to drive said data bus to a potential corresponding to a logic level of data received from said CMOS circuit, and an output buffer responsive to said CMOS circuit for generating data onto said output bus.

30. A semiconductor integrated circuit comprising:

(a) a first field effect transistor responsive to a first logic level of an input signal for transferring current from a first power supply;

(b) a second field transistor responsive to a second logic level of the input signal for transferring current to a second power supply;

(c) a first diode for carrying current from said first field effect transistor to a node;

(d) a second diode for carrying current from said node to said second field effect transistor;

(e) a third field effect transistor responsive to the first logic level of another input signal for transferring current from the first power supply to said first diode;

(f) a fourth field effect transistor responsive to the second logic level of said another input signal for transferring current to the second power supply;

(g) a first bipolar transistors responsive to the current from said first and third field effect transistors for transferring current from the first power supply to an output node, wherein said input signal and said another input signals are amplitude-limited so as to normally cause a current flow through said first and second diodes.

31. A semiconductor integrated circuit according to claim 30, further including (h) a third diode connected to said output node; and (i) fifth and sixth field effect transistor responsive to said second logic level of the input signals for transferring current from said third diode to said second power supply.

32. A semiconductor integrated circuit comprising:

(a) a first field effect transistor responsive to a first logic level of an input signal for transferring current from a first power supply;

(b) a second field transistor responsive to a second logic level of the input signal for transferring current to a second power supply;

(c) a first diode for carrying current from said first field effect transistor to a node;

(d) a second diode for carrying current from said node to said second field effect transistor;

(e) a third field effect transistor responsive to the first logic level of a second input signal for transferring current from the first power supply to said first diode;

(f) a fourth field transistor responsive to the second logic level of the second input signal for transferring current to the second power supply, said first diode carrying current from said first and third field effect transistor to a node, and said second diode carrying current from said node to said fourth field effect transistor;

(g) a first bipolar transistor responsive to the current from said first and third field effect transistor for transferring current from the first power supply to an output node;

(h) a fifth field effect transistor responsive to the second logic level of the second input signal for conducting current from said output node;

(i) a third diode for conducting current from said fifth field effect transistor to the second power supply; and (j) a second bipolar transistor of the same conductivity type as that of said first bipolar transistor and responsive to current from said fifth field effect transistor for conducting current from said output node to said second power supply.

33. A semiconductor integrated circuit according to claim 32, further including:

a sixth field effect transistor responsive to a potential at a base of said first bipolar transistor for conducting current from said third diode to said second power supply, said first bipolar transistor receiving the current from said first and third field effect transistor at the base.

34. A semiconductor integrated circuit comprising:

(a) a first field effect transistor responsive to a first logic level of an input signal for transferring current from a first power supply;

(b) a second field transistor responsive to a second logic level of the input signal for transferring current to a second power supply;

(c) a first diode for carrying current from said first field effect transistor to a node;

(d) a second diode for carrying current from said node to said second field effect transistor;

(e) a third field effect transistor responsive to the first logic level of a second input signal for transferring current from the first power supply to said first diode;

(f) a fourth field transistor responsive to the second logic level of the second input signal for transferring current to the second power supply via said second diode;

(g) a first bipolar transistor responsive to the current from said first and third field effect transistors for transferring current from the first power supply to a second node;

(h) a second bipolar transistor having a conductivity type opposite to that of said first bipolar transistor and responsive to the current conducted by said second and fourth field effect transistors for conducting current from said second node to said second power supply.

* * * * *